US012811265B2

(12) United States Patent
Khan et al.

(10) Patent No.: US 12,811,265 B2
(45) Date of Patent: Nov. 24, 2026

(54) COMPACT DIFFERENTIAL BIAS TEE

(71) Applicant: CIENA CORPORATION, Hanover, MD (US)

(72) Inventors: Bakhtiar Ali Khan, Arnprior (CA); Michael Vitic, Chelsea (CA); Gregory Brookes, Quebec (CA); Andrew Man Kin Lau, Ottawa (CA)

(73) Assignee: CIENA CORPORATION, Fulton, MD (US)

( * ) Notice: Subject to any disclaimer, the term of this patent is extended or adjusted under 35 U.S.C. 154(b) by 170 days.

(21) Appl. No.: 18/893,433

(22) Filed: Sep. 23, 2024

(65) Prior Publication Data

US 2026/0088480 A1 Mar. 26, 2026

(51) Int. Cl.
*H01P 1/20* (2006.01)
*H03H 7/38* (2006.01)

(52) U.S. Cl.
CPC ............. *H01P 1/2007* (2013.01); *H03H 7/38* (2013.01)

(58) Field of Classification Search
CPC ................................ H01P 1/2007; H03H 7/38
USPC ................................ 333/4, 5, 100, 101, 246
See application file for complete search history.

(56) References Cited

U.S. PATENT DOCUMENTS

| | | | |
|---|---|---|---|
| 4,318,124 A | 3/1982 | Nakamura et al. | |
| 5,221,908 A | 6/1993 | Katz et al. | |
| 6,229,408 B1 | 5/2001 | Jovanovich et al. | |
| 7,012,486 B2 | 3/2006 | Ji | |
| 8,644,029 B1 | 2/2014 | Ji | |
| 2003/0146809 A1 | 8/2003 | Buber et al. | |
| 2005/0101191 A1 | 5/2005 | Kim et al. | |
| 2005/0105911 A1 | 5/2005 | Keh et al. | |
| 2005/0147136 A1 | 7/2005 | Pobanz | |
| 2006/0022771 A1 | 2/2006 | Ji | |
| 2006/0198581 A1 | 9/2006 | Belmonte et al. | |
| 2007/0164843 A1 | 7/2007 | Yagisawa et al. | |
| 2008/0042785 A1 | 2/2008 | Yagisawa | |
| 2009/0065241 A1 * | 3/2009 | Liu | H05K 1/0245 174/255 |

(Continued)

FOREIGN PATENT DOCUMENTS

EP 3293530 A1 * 3/2018 ................ H01P 5/18

OTHER PUBLICATIONS

Bae, Youngseok , et al., "Automatic Bias Control Technique of Dual-Parallel Mach-Zehnder Modulator Based on Simulated Annealing Algorithm for Quadrupled Signal Generation", Photonics 2021, 8, 80, 2021, 9 pages.

(Continued)

*Primary Examiner* — Jorge L Salazar, Jr.
(74) *Attorney, Agent, or Firm* — Guntin & Gust, PLC; Kenneth S. Kwan

(57) ABSTRACT

Aspects of the subject disclosure may include, for example, a differential biasing device that includes first and second bias tees having respective high-frequency biased terminals, high-frequency unbiased terminals and biasing terminals. The first and second bias tees can be configured at least partially on and/or within different layers of a substrate to facilitate a compact configuration. The layers can include surface layers and/or internal layers that enable an overlapping of at least portions of the first and second bias tees. Other embodiments are disclosed.

20 Claims, 11 Drawing Sheets

350

(56) References Cited

U.S. PATENT DOCUMENTS

| | | | | |
|---|---|---|---|---|
| 2009/0078452 | A1* | 3/2009 | Pai | H05K 1/0245 174/254 |
| 2009/0263140 | A1* | 10/2009 | Kagaya | H05K 1/0253 398/139 |
| 2009/0304395 | A1 | 12/2009 | Hong et al. | |
| 2014/0002213 | A1 | 1/2014 | Clark et al. | |
| 2015/0067931 | A1 | 3/2015 | Hagmann | |
| 2017/0261605 | A1 | 9/2017 | Chu | |
| 2019/0171044 | A1 | 6/2019 | Li et al. | |
| 2020/0011978 | A1 | 1/2020 | Chu | |
| 2021/0013605 | A1 | 1/2021 | Jang | |
| 2022/0221743 | A1 | 7/2022 | Gupta et al. | |
| 2023/0353095 | A1* | 11/2023 | Kim | H03F 1/565 |

OTHER PUBLICATIONS

Berikaa, Essam , et al., "TFLN MZMs and Next-Gen DACs: Enabling Beyond 400 Gbps IMDD O-Band and C-Band Transmission", IEEE Photonics Technology Letters, vol. 35, No. 15, Aug. 1, 2023, 4 pages.

Wang, Xi , et al., "High-speed silicon photonic Mach-Zehnder modulator at 2 μm", Photonics Research, vol. 9, No. 4, Apr. 2021, 6 pages.

* cited by examiner

100

150

200

250

300

350

370

380

400

500

600

650

700

750

900

920

950

970

COMPACT DIFFERENTIAL BIAS TEE

FIELD OF THE DISCLOSURE

The subject disclosure relates to a compact differential bias tee.

BACKGROUND

A biasing network may include an electronic circuit adapted to insert a bias voltage, e.g., DC power, onto a time-varying (AC) signal. Such a combination of AC and DC may be advantageous to pass DC power from an external source to a power device, such as an amplifier. A particular class of biasing networks provides a three-port device, sometimes referred to as a "bias tee", in which a first port may be coupled to an external biasing supply, a second port may be coupled to a powered device supplying a time varying signal and relying upon the supplied bias power and a third port may be coupled to another external device and configured to pass the time varying signal while effectively attenuating and/or otherwise blocking the biasing source.

For example, a three-port bias tee may include a capacitor configured to block DC while allowing AC to pass at one of the ports and an inductor configured to block AC while allowing DC to pass at another one of the ports. A third port may be configured to pass both AC and DC. More generally, the bias tee may be considered as a diplexer.

BRIEF DESCRIPTION OF THE DRAWINGS

Reference will now be made to the accompanying drawings, which are not necessarily drawn to scale, and wherein.

DETAILED DESCRIPTION

Figure 1A:
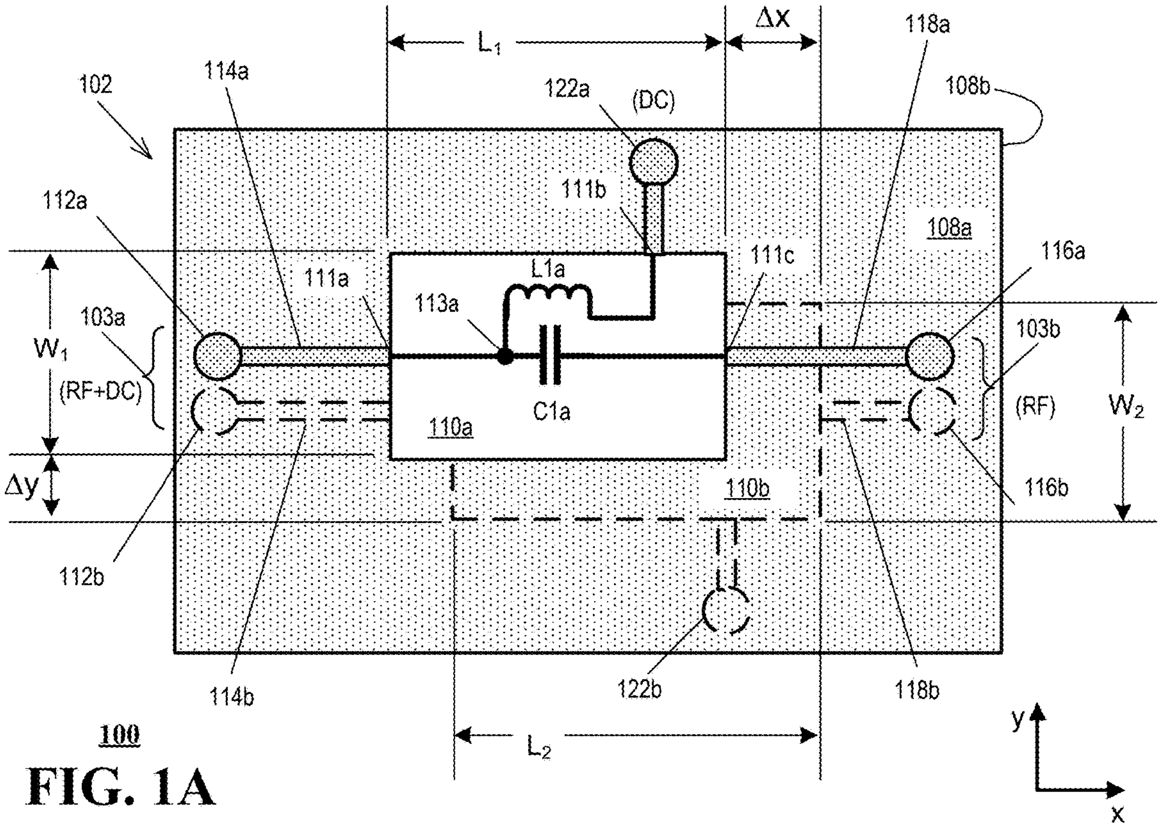
FIG. 1A is a top planar view if an example, non-limiting embodiment of a compact differential bias tee assembly in accordance with various aspects described herein.

The subject disclosure describes, among other things, illustrative embodiments of a compact differential biasing system having first and second biasing circuits that are configured at least partially along different layers of a substrate. The multi-layered configuration allows the first and second biasing circuits to assume various space saving configurations, for example, existing on different surfaces of a substrate and/or different layers of a multi-layer substrate. For example, the first and second biasing circuits may be configured on different non-parallel surfaces or non-parallel layers, e.g., different surfaces of a cubical substrate. In at least some embodiments, the first and second biasing circuits are configured to overlap with each other resulting in a space-saving configuration. The compact configuration allows the biasing systems to be spaced in close proximity with other circuit devices, including other biasing systems as may be used in high-density, high-frequency applications.

One or more aspects of the subject disclosure include a differential biasing device that includes a first bias tee positioned at least partially along a first layer of a substrate. The first bias tee includes a first biased radio frequency (RF) terminal, a first unbiased RF terminal and a first biasing terminal. The differential biasing device further includes a second bias tee positioned at least partially along a second layer of the substrate. The second bias tee includes a second biased radio frequency (RF) terminal, a second unbiased RF terminal and a second biasing terminal. The first layer differs from the second layer to facilitate a compact configuration of the first and second bias tees.

One or more aspects of the subject disclosure include a process of fabricating a differential biasing assembly. The process includes providing a first bias tee positioned at least partially along a first layer of a substrate. The first bias tee includes a first biased high-frequency terminal, a first unbiased high-frequency terminal and a first biasing terminal. The process further includes providing a second bias tee positioned at least partially along a second layer of the substrate. The second bias tee includes a second biased high-frequency terminal, a second unbiased high-frequency terminal and a second biasing terminal. The first layer differs from the second layer facilitating a non-coplanar configuration of the first and second bias tees.

One or more aspects of the subject disclosure include a differentially driven modulator system including a differential input port having a first input terminal and a second input terminal, configured to receive a differential input signal. The differentially driven modulator system also includes a first bias tee in communication with the first input terminal and positioned at least partially along a first layer of a substrate. The first bias tee includes a first biased RF terminal, a first unbiased RF terminal and a first biasing terminal. The differentially driven modulator system also includes a second bias tee in communication with the second input terminal and positioned at least partially along a second layer of the substrate. The second bias tee includes a second biased RF terminal, a second unbiased RF terminal and a second biasing terminal. The differentially drive modulator system further includes an output port including a first output terminal in communication with the first bias tee, wherein the first output terminal is configured to drive a modulator according to a first portion of the differential input signal, while inhibiting an application of the first biasing voltage to the modulator.

FIG. 1A is a top planar view if an example, non-limiting embodiment of a compact differential bias tee assembly 100 in accordance with various aspects described herein. The example differential bias tee assembly 100 is configured to transfer a composite signal with a first device, wherein the composite signal includes a time-varying, i.e., an AC voltage and/or current component together with a biasing offset value, i.e., a DC voltage and/or current component, while also transferring the time-varying or AC signal with a second device without the biasing offset or DC component. Namely the example differential bias tee assembly 100 can be configured to prevent and/or otherwise block the biasing voltage in a signal exchange with the second device. In at least some embodiments the example differential bias tee assembly 100 may be configured to prevent and/or otherwise block a transfer of the time-varying or AC signal with a biasing source, e.g., a DC voltage and/or current source.

In at least some embodiments, the example differential bias tee assembly 100 may include more than one bias tee circuits, e.g., two distinguishable bias tee circuits 110*a*, 110*b* adapted to couple to a biased differential signal port 103*a* having a first biased differential signal terminal 112*a*, e.g., a positive (+) terminal, and a second biased differential signal terminal 112*b*, e.g., a negative (−) terminal. For example, the first bias tee circuit 110*a* may be coupled to the first biased differential signal terminal 112*a* and the second bias tee circuit 110*b* may be coupled to the second biased differential signal terminal 112*b*. Likewise, the two distinguishable bias tee circuits 110*a*, 110*b* are further adapted to couple to an unbiased differential signal port 103*b* having a first unbiased differential signal terminal 116*a*, e.g., a positive (+) terminal, and a second unbiased differential signal terminal 116*b*, e.g., a negative (−) terminal.

In an example application, the first device may be an amplifier and/or driver circuit configured to provide a differential signal corresponding to information adapted for application to a modulator device. In at least some embodiments, the modulator device may be an electronic device adapted to modulate a signal for propagation via a communication medium. Without limitation, the communication medium may include unguided media, such as free space, e.g., radio-waves and/or line-of-sight optical links. Alternatively, or in addition, the communication medium may include guided media, such as cables, e.g., coaxial cables, single wire line, twin-lead, twisted pair, waveguides, including hollow waveguides, dielectric waveguides, transmission lines, generally, e.g., planar lines, microstrip, stripline, coplanar waveguides, balanced lines, powerline communications, and so on.

The example differential bias tee assembly 100 includes a supporting structure or substrate 102 defining an upper surface 108*a* and a lower surface 108*b* configured to support the first and second bias tee circuits 110*a*, 110*b* in a compact, space-saving configuration. By way of example, the first bias tee circuit 110*a* may be configured proximate to the upper surface 108*a*, while the second bias tee circuit 110*b* can be configured proximate to the lower surface 108*b*. According to the illustrative example the first biased differential signal terminal 112*a* is electrically coupled to a biased terminal 111*a* of the first bias tee circuit 110*a* via an upper input path 114*a*. Likewise, the second biased differential signal terminal 112*b* is coupled to a biased terminal of the lower bias tee circuit 110*b* via a lower input path 114*b*.

The example differential bias tee assembly 100 further includes an upper biasing supply terminal 122*a* electrically coupled to a biasing terminal 111*b* of the first bias tee circuit 110*a*. Likewise, the example differential bias tee assembly 100 further includes a lower biasing supply terminal 122*b* electrically coupled to a biasing terminal of the lower bias tee circuit 110*b*. The first unbiased differential signal terminal 116*a* of the unbiased differential signal port 103*b* is in communication with an unbiased terminal 111*c* of the first bias tee circuit 110*a*. Likewise, the second unbiased differential signal terminal 116*b* in communication with an unbiased terminal of the lower bias tee circuit 110*b*. In operation, the compact differential bias tee 100 facilitates a transfer of time-varying signals, e.g., radio frequency (RF) signals, between the biased and unbiased differential signal ports 103*a*, 103*b*, with a bias voltage, e.g., a DC offset, being applied to RF signals at the biased differential signal port 103*a*, while preventing or otherwise blocking any DC offset from being applied to the unbiased differential signal port 103*b*. In at least some embodiments, the upper bias tee circuit 100*a* includes a first capacitive circuit C1*a* providing a first capacitive impedance coupled between the biased terminal 111*a* and the unbiased terminal 111*c* and a first inductive circuit L1*a* providing a first inductive impedance coupled between the biasing terminal 111*b* and a first circuit node 113*a* electrically coupled between the first capacitive circuit C1*a* and the biased terminal 111*a*.

In operation, and with respect to the first bias tee circuit 110*a*, a first biasing supply voltage is applied to the biasing terminal 111*b* via the upper biasing supply terminal 122*a*. The biasing supply voltage can be coupled to the first biased differential signal terminal 112*a* via the first inductive circuit L1*a*, the biased terminal 111*b* and the upper input path 114*a*. The biasing supply voltage can operate to supply a biasing voltage to a circuit coupled to the example differential bias tee assembly 100, e.g., a modulation driver circuit (not shown). The first inductive circuit L1*a* is configured to operate as a low-pass filter, allowing a low frequency, e.g., a non-time varying or direct current (DC) voltage source to pass through the first inductive circuit L1*a*. The first inductive circuit L1*a*, as a low-pass filter, is configured to attenuate and/or otherwise prevent a passage of time varying signals to a biasing supply voltage source, e.g., via the biasing terminal 111*b* and the upper biasing supply terminal 122*a*. The first capacitive circuit C1*a* can be configured as a high-pass filter, allowing a high frequency, e.g., a time varying or alternating current (AC) voltage source to pass through the first capacitive circuit C1*a*, while attenuating and/or otherwise blocking the low-frequency, e.g., DC, voltage source from passing through the first capacitive circuit C1*a* to the first unbiased differential signal terminal 116*a* via the unbiased terminal 111*c* and the upper output path 118*a*.

In at least some embodiments, the second bias tee circuit 110*b* can be operable in a similar manner, e.g., having a second biasing supply voltage applied to a biasing terminal of the second bias tee circuit 110*b* via the lower biasing supply terminal 122*a*. The second biasing supply voltage can be coupled to the second biased differential signal terminal 112*b* via a second inductive circuit L1*b* (not shown) providing a second inductive impedance, the biased terminal of the second bias tee circuit 110*b* and the lower input path 114*b*. The second biasing supply voltage can operate to supply a second biasing voltage to the differential circuit coupled to the example differential bias tee assembly 100. The second inductive circuit L1*b* is configured to operate as a low-pass filter, allowing a low frequency, e.g., DC, voltage source to pass through the second inductive circuit L1*b*. The second inductive circuit L1*b*, as a low-pass filter, can be configured to attenuate and/or otherwise prevent a passage of time varying signals to the second biasing supply voltage source, e.g., via a biasing terminal 111*b* of the second bias tee circuit 110*b* and the lower biasing supply terminal 122*b*. The second capacitive circuit C1*b* providing a second capacitive impedance can be configured as a high-pass filter, allowing a high frequency, e.g., a time varying or alternating current (AC) voltage source to pass through the second capacitive circuit C1*b*, while attenuating and/or otherwise blocking passage of the low-frequency, e.g., DC, voltage source to the second unbiased differential signal terminal 116*b* via an unbiased terminal of the second bias tee circuit 110*b* and the lower output path 118*b*.

According to the illustrative example, the first bias tee circuit 110*a* is positioned on the upper surface 108*a* of the substrate 102 and occupies a first surface area $A_1$ approximated by a first circuit length $L_1$ and a first circuit width $W_1$, such that $A_1=L_1\times W_1$. Likewise, the second bias tee circuit 110*b* is positioned on the lower surface 108*b* of the substrate 102 and occupies a second surface area $A_2$ approximated by a second circuit length $L_2$ and a second circuit width $W_2$, such that $A_2=L_2\times W_2$. It is understood that in at least some embodiments, the first surface area may be approximately equal to the second surface area, i.e., $A_1\approx A_2$. In other embodiments, the areas may differ such that $A_1>A_2$ or $A_2>A_1$. It may be appreciated that a space savings offered by the example differential bias tee 100 results at least in part from a positioning of the first and second bias tee circuits 110*a*, 110*b* on different surfaces 108*a*, 108*b* of the substrate 102. For example, the upper surface 108*a* need only accommodate the first bias tee circuit 110*a* of the example differential bias tee assembly 100, while the lower surface 108*b* need only accommodate the second bias tee circuit 110*b* of the example differential bias tee assembly 100.

It may be appreciated further that a compactness offered by the example differential bias tee 100 results at least in part from an overlapping of the first and second bias tee circuits 110*a*, 110*b*. According to the illustrative example, the first differential bias tee circuit 110*a* overlaps the second bias tee circuit 110*b* in an x-direction by an amount determined by $L_2-\Delta x$ and in a y-direction by an amount determined by $W_2-\Delta y$. The overlapped area may thus be determined as the product of the x and y overlapped values, i.e., $A_{overlap}=(L_2-\Delta x)(W_2-\Delta y)$. It is apparent that the x and/or y offsets, i.e., $\Delta x$ and $\Delta y$ can be varied to achieve different amounts of overlap. For example, a fractional overlap of the second bias tee circuit 110*b* may be determined according to $A_{overlap}/A_2$ or alternatively, $(L_2-\Delta x)(W_2-\Delta y)/A_2$. It is understood that this may also be represented as a percentage. Alternatively, or in addition, the fractional overlap of the first bias tee circuit 110*a* may be determined in a similar manner according to $A_{overlap}/A_2$. To the extent $A_1\approx A_2$, overlaps of the first and second bias tee circuits 110*a*, 110*b* would be approximately the same. Accordingly, a resulting compactness may be controlled by an offset, e.g., an x and/or y offset, of the first and second bias tee circuits 110*a*, 110*b* with respect to each other and may be selectable and/or otherwise adjustable from 0% to 100%.

It is envisioned that in at least some embodiments, the first bias tee circuit 110*a* can be laid out and/or constructed substantially similar to the second bias tee circuit 110*b*, e.g., using a similar circuit layout and/or similar circuit components of the capacitive circuits C1*a*, C1*b* and/or the inductive circuits L1*a*, L1*b*. In at least some embodiments, the first bias tee circuit 110*a* is laid out and/or constructed as a substantial mirror image of the second bias tee circuit 110*b*. Alternatively, or in addition, in at least some embodiments, the first and second bias tee circuits 110*a*, 110*b* may vary to at least some degree, e.g., according to circuit and/or device layout, according to circuit and/or device values, and/or according to device, e.g., component style, size, shape, value operational ratings, and so on. In at least some embodiments, one or more of the inductive circuits and/or the capacitive circuits may be implanted with waveguide configurations adapted to provide the corresponding inductive and/or capacitive reactance values.

Figure 1B:
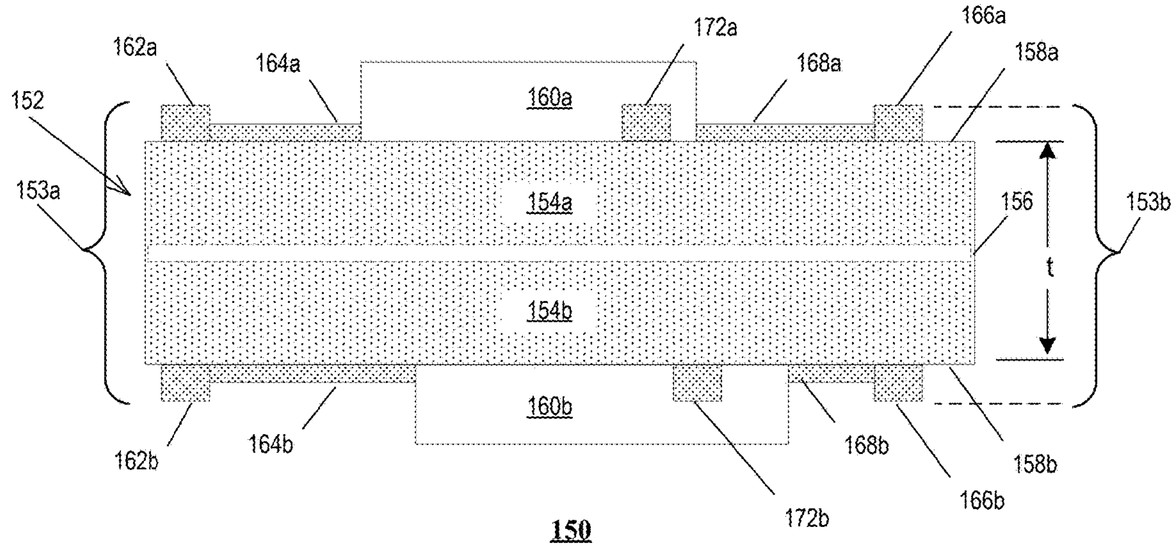
FIG. 1B is a side elevation view if an example, non-limiting embodiment of a compact differential bias tee assembly in accordance with various aspects described herein.

FIG. 1B is a side elevation view if an example, non-limiting embodiment of a compact differential bias tee assembly 150 in accordance with various aspects described herein. The compact differential bias tee assembly 150 includes a supporting structure of substrate 152 defining an upper surface 158*a* and a lower surface 158*b*, separated by a thickness t of the substrate. The compact differential bias tee assembly 150 includes a biased differential signal port 153*a* that includes a first biased differential signal terminal 162*a* proximate to the upper surface 158*a* and a second biased differential signal terminal 162*b* proximate to the lower surface 158*b*. The compact differential bias tee assembly 150 also includes an unbiased differential signal port 153*b* that includes a first unbiased differential signal terminal 168*a* proximate to the upper surface 158*a* and a second unbiased differential signal terminal 168*b* proximate to the lower surface 158*b*. A first bias tee circuit 160*a* is positioned in, on and/or above the upper surface 158*a*. Likewise, a second bias tee circuit 160*b* is positioned in, on and/or below the lower surface 158*b*. The first bias tee circuit 160*a* is in communication with the first biased differential signal terminal 162*a* via a first upper signal path 164*a*. The first bias tee circuit 160*a* is in communication with first unbiased differential signal terminal 166*a* via a second upper signal path 168*a* and in communication with an upper bias port 172*a*. Likewise, the second bias tee circuit 160*b* is in communication with the second biased differential signal terminal 162*b* via a first lower signal path 164*b*. The second bias tee circuit 160*b* is in communication with a second unbiased differential signal terminal 166*b* via a second lower signal path 168*b* and in communication with a lower bias port 172*b*. In operation, the compact differential bias tee 150 facilitates a transfer of time-varying signals, e.g., RF signals, between the biased and unbiased differential signal ports 153*a*, 153*b*, with a bias voltage, e.g., a DC offset, being applied to RF signals at the biased differential signal port 153*a*, while preventing or otherwise blocking any DC offset from being applied to the unbiased differential signal port 153*b*.

In operation, the upper bias port 172*a* is coupled to a first biasing source, e.g., a DC supply, while the lower bias port 172*b* is coupled to a second biasing source. The first bias tee circuit 160*a* facilitates directing an output of the first biasing source to the first biased differential signal terminal 162*a*, while simultaneously preventing it from being directed to the first unbiased differential signal terminal 166*a*. Likewise, the second bias tee circuit 160*b* facilitates directing an output of the second biasing source to the second biased differential signal terminal 162*b*, while simultaneously preventing it from being directed to the second unbiased differential signal terminal 166*b*. The first bias tee circuit 160*a* further facilitates transfers of time-varying signals between the first biased differential signal terminal 162*a* and the first unbiased differential signal terminal 166*a*, while substantially preventing transfer of any time-varying signals between the first biased differential signal terminal 162*a* and the upper bias port 172*a*. Likewise, the second bias tee circuit 160*b* further facilitates transfers of time-varying signals between the second biased differential signal terminal 162*b* and the second unbiased differential signal terminal 166*b*, while substantially preventing transfer of any time-varying signals between the second biased differential signal terminal 162*b* and the lower bias port 172*b*.

In at least some embodiments, the s substrate 152 can include a substantially planer structure and/or a substantially non-planer structure, e.g., a three-dimensional structure and/or a multi-planer structure. It is understood that at least some of the substrates 152 may have multiple surfaces and/or layers. At least some of the surfaces and/or layers may be co-planar and/or otherwise aligned in parallel planes. Alternatively, or in addition, at least some of the surfaces and/or layers may be non-co-planar and/or otherwise non-aligned, e.g., not aligned in parallel planes. It at least some embodiments some of the surfaces and/or layers may be orthogonal to other surfaces and/or layers, e.g., different surfaces of a cubical structure. Without limitation, the substrate 152 may be rigid, semi-rigid and/or otherwise flexible. By way of example, a substrate 162 may include a substantially rigid structure that may be fashioned from a substantially insulating and/or dielectric structure, e.g., a ceramic, a glass, a polymer, a composite material, e.g., fiberglass, and the like. Alternatively, or in addition, the substrate 152 may include a printed circuit board (PCB), a semiconductor substrate, an integrated circuit device. Other suitable structures for the substrate 152 may include, without limitation, substrate like PCBs (SLP) devices, flexible circuits, and the like. It is understood that any of the example substrates 102, 152 disclosed herein may be configured to include one or more substantially conductive structures, e.g., wires, etches, layers, and so on. For example, the first upper and lower signal paths 164*a*, 164*b* and/or the second upper and lower signal paths 168*a*, 168*b* may be configured as metallic structures formed upon a substrate 152 that is insulative. In at least some embodiments, the substrate 152 can include a flexible structure, fashioned from a substantially insulating and/or dielectric structure, e.g., a flexible circuit board.

In at least some embodiments, the substrate 152 may include multiple layers. According to the illustrative example, the substrate 152 includes an upper layer 154*a* and a lower layer 154*b* separated by an intermediate layer 156. The upper layer 154*a* can define the upper surface 158*a*, while the lower layer can define the lower surface 158*b*. The layers 154*a*, 154*b*, generally 154 may include any number of layers formed from the same material, similar materials and/or different materials. For example, the upper and lower layers 154*a*, 154*b* may be insulating layers, while the intermediate layer 156 may be a metal layer, e.g., a ground plane. Other layers may include circuit layers, power plane layers, semiconductor layers and so on.

In some embodiments, the first bias tee circuit 160*a* may reside entirely in or on the upper surface 158*a*. Alternatively, or in addition, at least a portion of the first bias tee circuit 160*a* may reside in one or more different layers that be positioned below and/or above the upper surface 158*a*. For example, at least a portion of the first bias tee circuit 160*a* may reside in a lower layer and/or otherwise traverse more than one layers 154*a*, 154*b*, 156. Likewise, in at least some embodiments, the second bias tee circuit 160*b* may reside entirely in or on the lower surface 158*b*. Alternatively, or in addition, at least a portion of the second bias tee circuit 160*b* may reside in one or more different layers that be positioned above and/or below the lower surface 158*b*.

For example, at least a portion of the second bias tee circuit 160*b* may reside in an upper layer and/or otherwise traverse more than one layers 154*a*, 154*b*, 156. It is understood that in at least some embodiments, the first bias tee circuit 160*a* may include a first portion positioned in, on or above the upper surface 158*a* and a second portion positioned in, on or below the lower surface 158*b*. Alternatively, or in addition, the second bias tee circuit 160*b* may include a first portion positioned in, on or below the lower surface 158*b* and a second portion positioned in, on or above the upper surface 158*a*. It is understood that in at least some embodiments, circuit routing between and/or across different layers 154*a*, 154*b*, 156 may utilize electrically conductive via structures.

In at least some embodiments, the first and second bias tee circuits 160*a*, 160*b* may be similar in one or more of size, circuit layout, construction, materials, component types and/or component values, e.g., capacitance, inductance, resistance. In at least some embodiments the first and second bias tee circuits 160*a*, 160*b* may differ in one or more of size, circuit layout, construction, materials, component types and/or component values, e.g., capacitance, inductance, resistance.

Although the illustrative example compact differential bias tee assembly 150 includes a differential signal port 153 having a first biased differential signal terminal 162*a* positioned on the upper surface 158*a* and a second biased differential signal terminal 162*b* positioned on the lower surface 158*b*, it is understood that in at least some embodiments, the first and second biased differential signal terminals 162*a*, 162*b* may be positioned along a common layer that may include the upper layer 154*a*, the lower layer 154*b*, and/or an intermediate layer 156. Similarly, although the illustrative example compact differential bias tee assembly 150 includes a first unbiased differential signal terminal

166*a* positioned on the upper surface 158*a* and a second unbiased differential signal terminal 166*b* positioned on the lower surface 158*b*, it is understood that in at least some embodiments, the first and second unbiased differential signal terminals 166*a*, 166*b* may be positioned along a common layer that may include the upper layer 154*a*, the lower layer 154*b*, and/or an intermediate layer 156. It is understood that in at least some embodiments, one or more via structures may be incorporated into the compact differential bias tee assembly 150 to facilitate routing of signals and/or biasing voltages and/or currents across different layers 154*a*, 154*b*, 156.

Figure 2A:
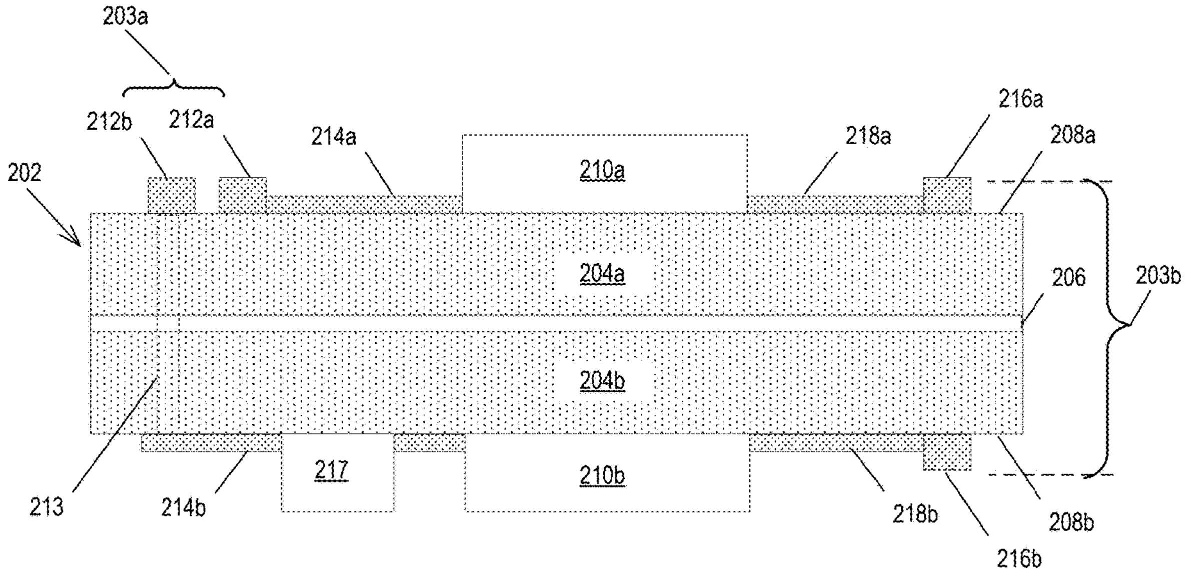
FIG. 2A is a side elevation view if an example, non-limiting embodiment of a compact differential bias tee assembly in accordance with various aspects described herein.

FIG. 2A is a side elevation view if an example, non-limiting embodiment of a compact differential bias tee assembly 200 in accordance with various aspects described herein. The compact differential bias tee assembly 200 includes a substrate 202 defining an upper surface 208*a* and a lower surface 208*b*. The compact differential bias tee assembly 200 includes a biased differential signal port 203*a* that includes a first biased differential signal terminal 202*a* and a second biased differential signal terminal 202*b*, both proximate to the upper surface 208*a*. Likewise, the two distinguishable bias tee circuits 210*a*, 210*b* are further adapted to couple to an unbiased differential signal port 203*b* having a first unbiased differential signal terminal 216*a*, e.g., a positive (+) terminal, and a second unbiased differential signal terminal 216*b*, e.g., a negative (−) terminal. A first bias tee circuit 210*a* is positioned in, on and/or above the upper surface 208*a*. Likewise, a second bias tee circuit 210*b* is positioned in, on and/or below the lower surface 208*b*. The first bias tee circuit 210*a* is in communication with the first biased differential signal terminal 212*a* via a first upper signal path 214*a*. The first bias tee circuit 210*a* is in communication with the first unbiased differential signal terminal 216*a* via a second upper signal path 218*a*. Likewise, the second bias tee circuit 210*b* is in communication with the second biased differential signal terminal 212*b* via a first lower signal path 214*b* and an electrically conductive via 213 extending from the lower surface 208*b* to the upper surface 208*a*. The second bias tee circuit 210*b* is in further communication with the second unbiased differential signal terminal 216*b* via a second lower signal path 218*b*. It is worth noting that in this example embodiment, the substrate 202 includes an upper layer 204*a* defining the upper surface 208*a*, a lower layer 204*b* defining the lower surface 208*b* and an intermediate layer that includes an electrically conducting, e.g., metal, ground plane 206. It is understood that the ground plane 206 defines an aperture to permit passage of the electrically conductive via 213. In operation, the compact differential bias tee 200 facilitates a transfer of time-varying signals, e.g., RF signals, between the biased and unbiased differential signal ports 203*a*, 203*b*, with a bias voltage, e.g., a DC offset, being applied to RF signals at the biased differential signal port 203*a*, while preventing or otherwise blocking any DC offset from being applied to the unbiased differential signal port 203*b*.

In at least some embodiments, it is advantageous for the separate portions of the compact differential bias tee assembly 200 to exhibit similar performance characteristics. Such performance characteristics can include, without limitation, input impedance, output impedance, characteristic impedance, signal delay, and so on. When evaluated according to multiport networks, e.g., a four-port network, the corresponding input ports and/or output ports may exhibit similar network parameters, e.g., scattering or "S" parameters, such that $S_{11}\approx S_{22}$, $S_{21}\approx S_{12}$, $S_{33}\approx S_{44}$, $S_{43}\approx S_{34}$.

At least one approach to ensuring similar performance characteristics is to utilize similar circuit components, similar circuit configurations, similar signal lengths, similar transmission lines and so on. It is apparent from the present example, that even with all else being equal, the separate portions of the compact differential bias tee assembly 200 differ at least by virtue of the electrically conductive via 213. Namely, the electrically conductive via 213 is included in a circuit path extending between the second biased differential signal terminal 212*b* and the lower output port, whereas the circuit path extending between the first biased differential signal terminal 212*a* and the first unbiased differential signal terminal 216*a* does not include an electrically conducting via.

It is understood that a presence of the electrically conductive via 213 may alter a circuit impedance, e.g., between the second biased differential signal terminal 212*b* and the first lower signal path 214*b*. In at least some embodiments, an additional circuit may be introduced to mitigate the effects of the electrically conductive via 213. According to the illustrative example, an impedance matching circuit 217 can be included, e.g., along the lower surface 208*b* and between the electrically conductive via 213 and the second bias tee circuit 210*b*, e.g., along the first lower signal path 214*b*. Alternatively, or in addition, the impedance matching circuit 217 may be incorporated into the second bias tee circuit 210*b*.

Figure 2B:
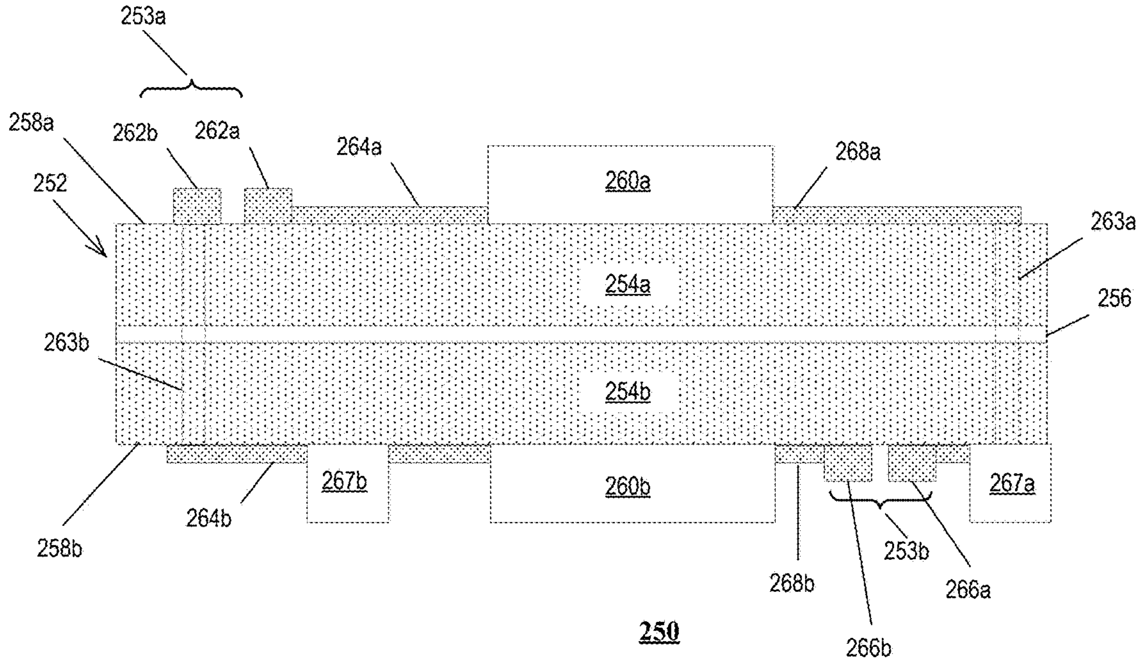
FIG. 2B is a side elevation view if another example, non-limiting embodiment of a compact differential bias tee assembly in accordance with various aspects described herein.

FIG. 2B is a side elevation view if another example, non-limiting embodiment of a compact differential bias tee assembly in accordance with various aspects described herein. The compact differential bias tee assembly 250 includes a substrate 252 defining an upper surface 258*a* and a lower surface 258*b*. The compact differential bias tee assembly 250 includes a biased differential signal port 253*a* that includes a first biased differential signal terminal 252*a* and a second biased differential signal terminal 252*b*, both proximate to the upper surface 258*a*. The compact differential bias tee assembly 250 also includes an unbiased differential signal port 253*b* that includes a first unbiased differential signal terminal 268*a* and a second unbiased differential signal terminal 268*b*, both proximate to the lower surface 258*b*. A first bias tee circuit 260*a* is positioned in, on and/or above the upper surface 258*a*. Likewise, a second bias tee circuit 260*b* is positioned in, on and/or below the lower surface 258*b*. The first bias tee circuit 260*a* is in communication with the first biased differential signal terminal 262*a* via a first upper signal path 264*a*. The first bias tee circuit 260*a* is in communication with a first unbiased differential signal terminal 266*a* via a second upper signal path 268*a* and a first electrically conducting via 263*a* extending from the upper surface 258*a* to the lower surface 258*b*.

Likewise, the second bias tee circuit 260*b* is in communication with the second biased differential signal terminal 262*b* via a first lower signal path 264*b* and a second electrically conducting via 263*b* extending from the upper surface 258*a* to the lower surface 258*b*. The second bias tee circuit 260*b* is in further communication with a second unbiased differential signal terminal 266*b* via a second lower signal path 268*b*. Once again, the substrate 252 of the example embodiment includes a first layer 254*a* defining the upper surface 258*a*, a second layer 254*b* defining the lower surface 258*b* and an intermediate layer that includes an electrically conducting, e.g., metal, ground plane 256. It is understood that the ground plane 256 defines at least two apertures to permit passage of the first and second electrically conductive vias 263*a*, 263*b*.

The illustrative example also includes a first impedance matching circuit 267*a* positioned along the lower surface 258*b*, between the first electrically conducting via 263*a* and the first unbiased differential signal terminal 266*a*. A second impedance matching circuit 267*b* is also positioned along the lower surface 258*b*, between the second electrically conducting via 263*b* and the second bias tee circuit 210*b*, e.g., along the lower input signal path 264*b*. Alternatively, or in addition, the second impedance matching circuit 267*b* may be incorporated into the second bias tee circuit 210*b*.

It is understood that, in at least some embodiments and without restriction, the positions of the first and second biased differential signal terminals 262*a*, 262*b* may be on the same surface, which may include the upper surface 258*a*, the lower surface 258*b*, or some other, intermediate surface, such as within one of the first and/or second layers 254*a*, 254*b* and/or at a boundary between layers of the substrate 252. In at least some embodiments, the positions of the first and second biased differential signal terminals 262*a*, 262*b* may be on different surfaces, which may include different ones of the upper surface 258*a*, the lower surface 258*b*, or some other, intermediate surface, such as within one of the first and/or second layers 254*a*, 254*b* and/or at a boundary between layers of the substrate 252.

It is understood that, in at least some embodiments and without restriction, the positions of the first and second impedance matching circuits 267*a*, 267*b* may be on the same surface, which may include the upper surface 258*a*, the lower surface 258*b*, or some other, intermediate surface, such as within one of the first and/or second layers 254*a*, 254*b* and/or at a boundary between layers of the substrate 252. In at least some embodiments, the positions of the first and second impedance matching circuits 267*a*, 267*b* may be on different surfaces, which may include different ones of the upper surface 258*a*, the lower surface 258*b*, or some other, intermediate surface, such as within one of the first and/or second layers 254*a*, 254*b* and/or at a boundary between layers of the substrate 252.

It is understood that, in at least some embodiments and without restriction, the positions of the first and second bias tee circuits 260*a*, 260*b* may be on the same surface, which may include the upper surface 258*a*, the lower surface 258*b*, or some other, intermediate surface, such as within one of the first and/or second layers 254*a*, 254*b* and/or at a boundary between layers of the substrate 252. In at least some embodiments, the positions of the first and second bias tee circuits 260*a*, 260*b* may be on different surfaces, which may include different ones of the upper surface 258*a*, the lower surface 258*b*, or some other, intermediate surface, such as within one of the first and/or second layers 254*a*, 254*b* and/or at a boundary between layers of the substrate 252.

Figure 3A:
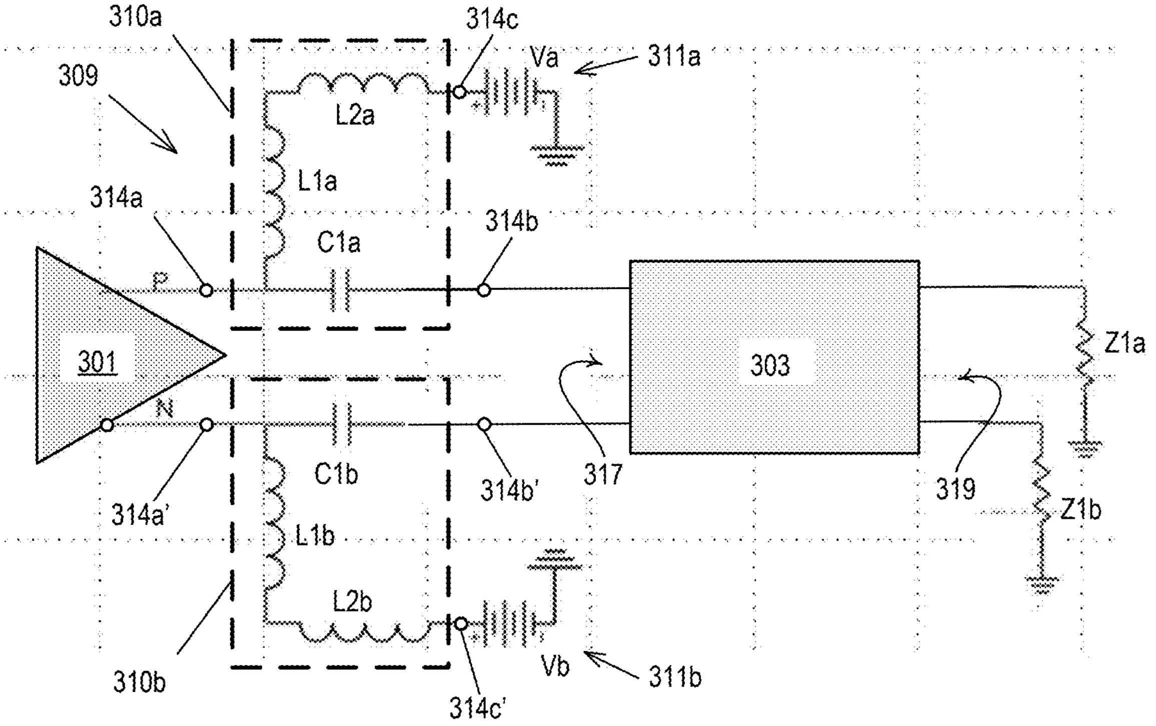
FIG. 3A is a schematic diagram illustrating an example, non-limiting embodiment of a circuit including a compact differential bias tee driving a differential input of a device in accordance with various aspects described herein.

FIG. 3A is a schematic diagram illustrating an example, non-limiting embodiment of a circuit 300 including a compact differential bias tee 309 driving a differential port 317 of a driven device 303 in accordance with various aspects described herein. The compact differential bias tee 309 includes a first bias tee circuit 310*a* having a first biased differential signal terminal 314*a*, e.g., a positive (+)terminal and a second bias tee circuit 310*b* having a second biased differential terminal 314*a*', e.g., a negative (−)terminal. The first biased differential terminal 314*a* is coupled to a first leg of a differential output of a differential signal source 301, whereas the second biased differential terminal 314*a*' is coupled to a second leg of the differential output of the differential signal source 301.

The first bias tee circuit 310*a* is a three-terminal device, with the first biased differential terminal 314*a*, a second unbiased differential terminal 314*b*, and a third biasing terminal 314*c* coupled to a first bias source 311*a*. In operation, the first bias tee circuit 310*a* facilitates application of a DC offset or bias to an RF signal at the first biased differential terminal 314*a*, while preventing application of the DC offset or bias to an RF signal at the second unbiased differential terminal 314*b*. The DC offset or bias is obtained at least in part from a bias voltage applied to the third biasing terminal 314*c*. In at least some embodiments, the first bias tee circuit 310*a* includes a series capacitor C1*a* coupled between the first biased differential terminal 314*a* and the second unbiased differential terminal 314*b*, and a shunt series inductance, L1*a* and L2*a* coupled between the third biasing terminal 314*c* and the first biased differential terminal 314*a*, e.g., between the first biased differential terminal 314*a* and the series capacitor C1*a*. The reactive components, i.e., the C1*a*, L1*a*, L2*a*, of the first bias tee circuit 310*a* can be selected according to application requirements, such as operating frequencies, operating frequency bandwidths, power levels, construction techniques, e.g., integrated circuit, surface mount, PCB, discrete components, and so on.

Similarly, the second bias tee circuit 310*b* is also three-terminal device, with a first biased differential terminal 314*a*', a second unbiased differential terminal 314*b*', and a third biasing terminal 314*c*' coupled to a second bias source 311*b*. In operation, the second bias tee circuit 310*b* also facilitates application of a DC offset or bias to an RF signal at the first biased differential terminal 314*a*', AC only at the second unbiased differential terminal 314*b*' and DC only at the third biasing terminal 314*c*'. In at least some embodiments, the second bias tee circuit 310*b* includes a series capacitor C1*b* coupled between the first biased differential terminal 314' and the second unbiased differential terminal 314*b*', and a shunt series inductance, L1*b* and L2*b* coupled between the third biasing terminal 314*c*' and the first biased differential terminal 314*a*', e.g., between the first biased differential terminal 314*a*' and the series capacitor C1*b*. The reactive components, i.e., the C1*b*, L1*b*, L2*b*, of the second bias tee circuit 310*b* also can be selected according to application requirements, such as operating frequencies, operating frequency bandwidths, power levels, construction techniques, e.g., integrated circuit, surface mount, PCB, discrete components, and so on. The second unbiased differential outputs 314*b*, 314*b*' are coupled to a differential port 317 of the drive device 303. The example driven device 303 also includes a differential output port 319 terminated in first and second load impedances Z1*a*, Z1*b*.

Figure 3B:
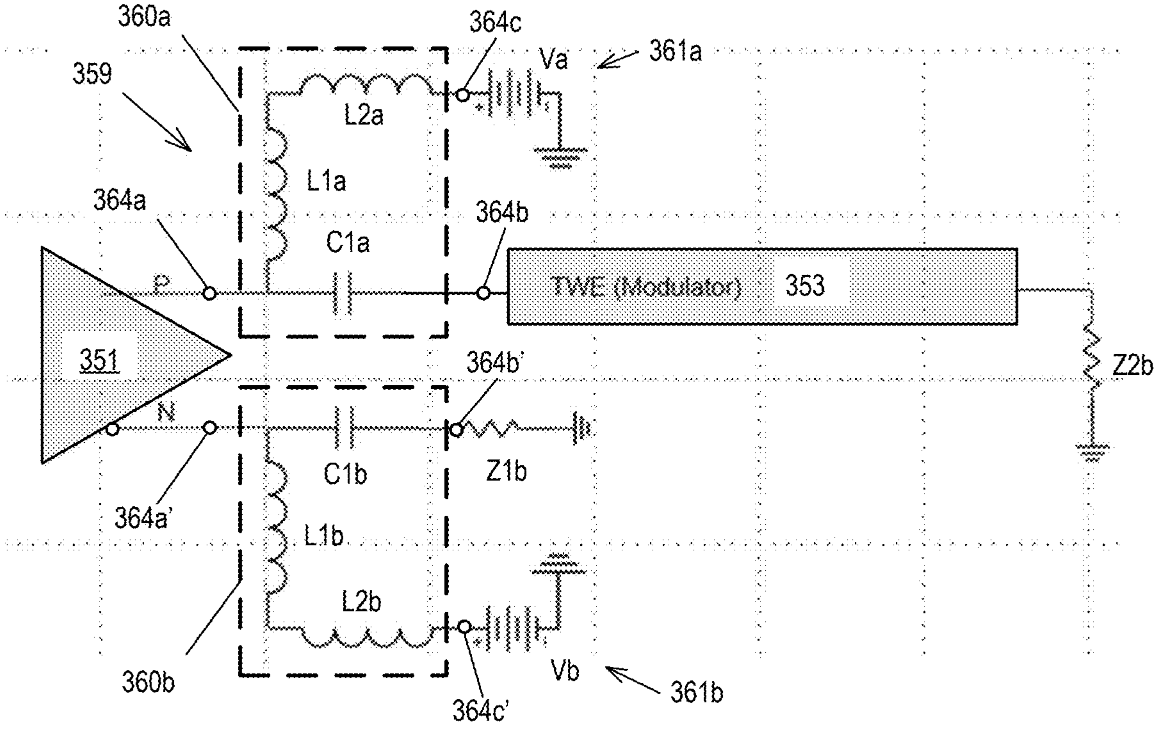
FIG. 3B is a schematic diagram illustrating another example, non-limiting embodiment of a circuit including a compact differential bias tee driving a single-ended input of a device in accordance with various aspects described herein.

FIG. 3B is a schematic diagram illustrating another example, non-limiting embodiment of a circuit 350 including a compact differential bias tee 359 driving a single-ended input of a driven device 353 in accordance with various aspects described herein. The compact differential bias tee 359 includes a first bias tee circuit 360*a* having a first biased differential terminal 364*a*, e.g., a positive (+)terminal and a second bias tee circuit 360*b* having a second biased differential terminal 364*a*', e.g., a negative (−)terminal. The first differential biased terminal 364*a* is coupled to a first leg of a differential output of a differential signal source 351, whereas the second biased differential terminal 364*a*' is coupled to a second leg of the differential signal source 351.

The first bias tee circuit 360*a* is a three-terminal device, with the first biased differential terminal 364*a*, a second unbiased differential terminal 364*b*, and a third biasing terminal 364*c* coupled to a first bias source 361*a*. In operation, the first bias tee circuit 360*a* facilitates application of a DC offset or bias to an RF signal at the first biased differential terminal 364*a*, while preventing application of the DC offset or bias to an RF signal at the second unbiased differential terminal 364*b*. The DC offset or bias is obtained at least in part from a bias voltage applied to the third biasing terminal 364*c*. In at least some embodiments, the first bias tee circuit 360*a* includes a series capacitor C1*a* coupled between the first biased differential terminal 364*a* and the second unbiased differential terminal 364*b*, and a shunt series inductance, L1*a* and L2*a* coupled between the third biasing terminal 364*c* and the biased differential terminal 364*a*, e.g., between the first biased differential terminal 364*a* and the series capacitor C1*a*. The reactive components, i.e., the C1*a*, L1*a*, L2*a*, of the first bias tee circuit 360*a* can be selected according to application requirements, such as operating frequencies, operating frequency bandwidths, power levels, construction techniques, e.g., integrated circuit, surface mount, PCB, discrete components, and so on.

Similarly, the second bias tee circuit 360*b* is also three-terminal device, with a first biased differential terminal 364*a*', a second unbiased differential terminal 364*b*', and a third biasing terminal 364*c*' coupled to a second bias source 361*b*. In operation, the second bias tee circuit 360*b* also facilitates application of a DC offset or bias to an RF signal at the first biased differential terminal 314*a*', AC only at the unbiased differential terminal 364*b*' and DC only at the third biasing terminal 364*c*'. In at least some embodiments, the second bias tee circuit 360*b* includes a series capacitor C1*b* coupled between the first biased differential terminal 364*a*' and the second unbiased differential terminal 364*b*', and a shunt series inductance, L1*b* and L2*b* coupled between the third biasing terminal 364*c*' and the first biased differential terminal 364*a*', e.g., between the first biased differential terminal 364*a*' and the series capacitor C1*b*. The reactive components, i.e., the C1*b*, L1*b*, L2*b*, of the second bias tee circuit 360*b* also can be selected according to application requirements, such as operating frequencies, operating frequency bandwidths, power levels, construction techniques, e.g., integrated circuit, surface mount, PCB, discrete components, and so on. The second unbiased differential output 314*b* of the first bias tee circuit 360*a* is coupled to a single-ended input of the driven device 353. The second unbiased differential output 314*b*' of the second bias tee circuit 360*b* is coupled to a terminating load impedance Z1*b*.

Figure 3C:
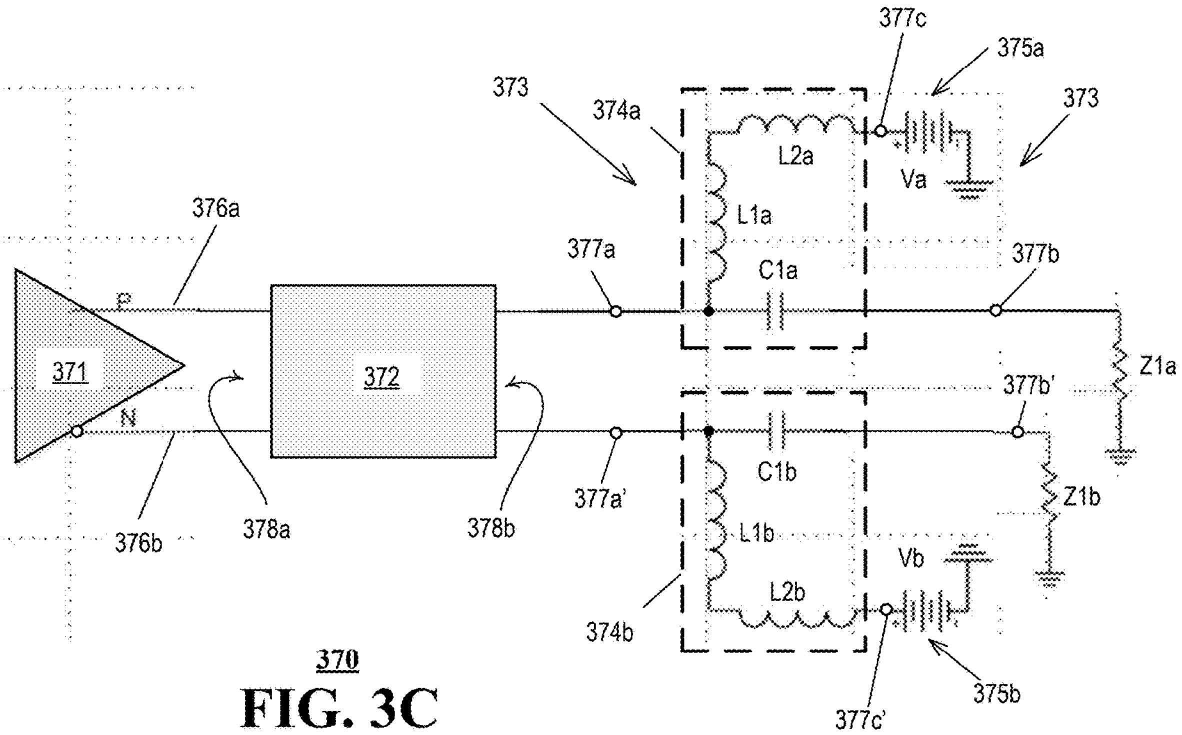
FIG. 3C is a schematic diagram illustrating another example, non-limiting embodiment of a circuit including a compact differential bias tee driving a differential input of a device in accordance with various aspects described herein.

FIG. 3C is a schematic diagram illustrating another example, non-limiting embodiment of a circuit 370 including a compact differential bias tee 373 coupled to a differentially driven device 372. The example circuit 370 includes a differential driver device 371 providing a differential output including a positive (+) terminal 376*a* and a negative (−) terminal 376*b*. The differentially driven device 372 includes a differential input port 378 coupled to the positive and negative terminals 376*a*, 376*b* and a differential output port 378*b* including positive and negative terminals. According to the illustrative embodiment, the differentially driven device 372 is coupled to the differential output port 378*b*.

In more detail, the compact differential bias tee 373 includes a first bias tee circuit 374*a* having a first biased differential terminal 377*a*, a second unbiased differential terminal 377*b* and a third biasing terminal 377*c*. The first biased differential terminal 377*a* is coupled to a positive (+) terminal of the differential output port 378*b*, the second unbiased differential terminal 377*b* is coupled to a first terminating load impedance Z1*a*, and the third biasing terminal 377*c* is coupled to a first biasing source 375*a*. In operation, the first biasing source 375*a* provides a first DC offset, or bias coupled to the first biased differential terminal 377*a* to obtain an RF signal including the first DC offset. The first DC offset or bias is prevented from coupling from the first biasing source 375*a* to the second unbiased differential terminal 377*b* and to the first terminating load impedance Z1*a*.

The compact differential bias tee 373 also includes a second bias tee circuit 374*b* having a first biased differential terminal 377*a*', a second unbiased differential terminal 377*b*' and a third biasing terminal 377*c*'. The first biased differential terminal 377*a*' is coupled to a negative (−) terminal of the differential output port 378*b*, the second unbiased differential terminal 377*b*' is coupled to a second terminating load impedance Z1*b*, and the third biasing terminal 377*c* is coupled to a second biasing source 375*b*. In operation, the second biasing source 375*b* provides a second DC offset, or bias coupled to the first biased differential terminal 377*a*' to obtain an RF signal including the second DC offset. The second DC offset 375*b* or bias is prevented from coupling from the second biasing source 375*b* to the second unbiased differential terminal 377*b*' and to the second terminating load impedance Z1*b*.

Figure 3D:
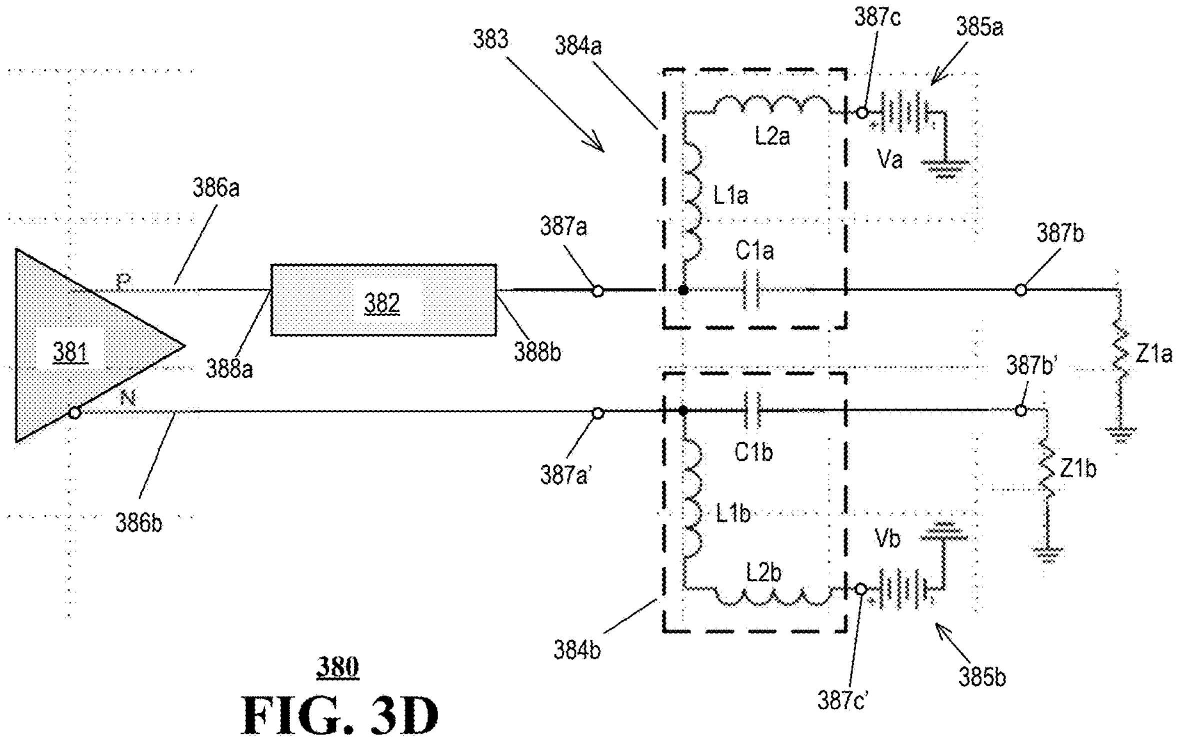
FIG. 3D is a schematic diagram illustrating yet another example, non-limiting embodiment of a circuit including a compact differential bias tee driving a single-ended input of a device in accordance with various aspects described herein.

FIG. 3D is a schematic diagram illustrating another example, non-limiting embodiment of a circuit 380 including a compact differential bias tee 383 coupled to a single-ended driven device 382. The example circuit 380 includes a differential driver device 381 providing a differential output including a positive (+) terminal 386*a* and a negative (−) terminal 386*b*. The single-ended driven device 382 includes a single-ended input terminal 388*a* coupled to the positive terminals 386*a* and a single-ended output terminal 388*b*. According to the illustrative embodiment, one terminal of the differential driver device 381 is coupled to the single-ended input terminal 388*a*.

In more detail, the compact differential bias tee 383 includes a first bias tee circuit 384*a* having a first biased differential terminal 387*a*, a second unbiased differential terminal 387*b* and a third biasing terminal 387*c*. The first biased differential terminal 387*a* is coupled to the single-ended output terminal 388*b* of the single-ended driven device 382, the second unbiased differential terminal 387*b* is coupled to a first terminating load impedance Z1*a*, and the third biasing terminal 387*c* is coupled to a first biasing source 385*a*. In operation, a first DC offset, or bias obtained from the first biasing source 385*a* is coupled to the first biased differential terminal 387*a* to obtain an RF signal including the DC offset. The first DC offset or bias is prevented from coupling from the first biasing source 385*a* to the first unbiased differential terminal 387*b* and to the first terminating load impedance Z1*a*.

The compact differential bias tee 373 also includes a second bias tee circuit 384*b* having a first biased differential terminal 387*a*', a second unbiased differential terminal 387*b*' and a third biasing terminal 387*c*'. The first biased differential terminal 377*a*' is coupled to a negative (−) terminal of the differential output port 378*b*, the second unbiased differential terminal 387*b*' is coupled to a second terminating load impedance Z1*b*, and the third biasing terminal 387*c* is coupled to a second biasing source 385*b*. In operation, a DC offset, or bias provided by the second biasing source 385*b* is coupled to the first biased differential terminal 387*a*' to obtain an RF signal including the DC offset. The second DC offset 387*c*' or bias is prevented from coupling from the second biasing source 385*b* to the second unbiased differential terminal 387*b* and to the second terminating load impedance Z1*b*.

Figure 4:
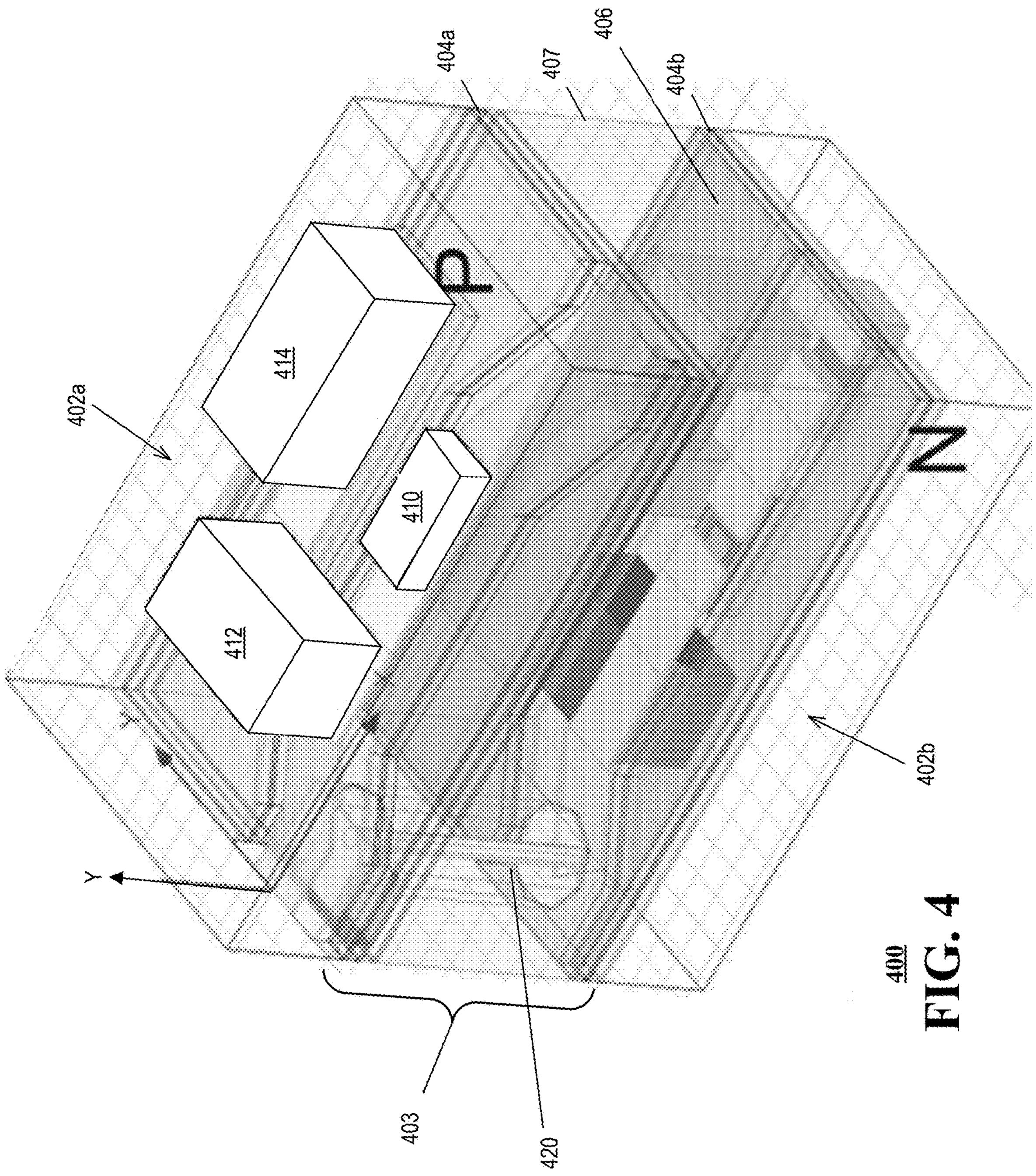
FIG. 4 is a top perspective view if an example, non-limiting embodiment of a compact differential bias tee module in accordance with various aspects described herein.

FIG. 4 is a top perspective view if an example, non-limiting embodiment of a compact differential bias tee module 400 in accordance with various aspects described herein. The compact differential bias tee module 400 includes a substantially planar substrate 403 upon which circuits and circuit components are provided on opposing sides. The example substrate 403 includes an upper circuit layer 404*a* that includes electrically conductive, e.g., metal, traces forming electronic circuits and/or transmission lines. In at least some embodiments, the upper circuit layer 404*a* may include multiple layers, e.g., metal layers and/or insulating layers as may be used for the conductive traces, including transmission lines, electrical ground, power, and the like. In at least some embodiments, the upper circuit layer 404*a* includes one or more discrete components. According to the illustrative embodiments, the upper circuit layer 404*a* includes a blocking capacitor 410, a first inductor 412, sometimes referred to as a radio frequency (RF) choke and a second inductor 414. In at least some embodiments, one or more of the blocking capacitor 410, the first inductor 412 or the second inductor 414 can include surface mount components. As is well understood, the surface mount components may be electrically and/or physically coupled to a top surface of the upper circuit layer 404*a* using a solder paste in accordance with a solder reflow process, a conductive epoxy, and the like. The upper circuit layer 404*a* with the components 410, 412, 414 mounted thereon provides an upper bias tee circuit 402*a*.

Further according to the illustrative example, the compact differential bias tee module 400 includes a first signal path, e.g., a positive (+) signal path as represented by the upper circuit layer 404*a* and the components 410, 412, 414 coupled thereto. The compact differential bias tee module 400 also includes lower circuit layer 404*b* configured to provide a second signal path, e.g., a negative (−) signal path. The upper and lower circuit layers 404*a*, 404*b* can be separated by a substrate core 407. The lower circuit layer 404*b* also includes electrically conductive, e.g., metal, traces forming electronic circuits and/or transmission lines. In at least some embodiments, the lower circuit layer 404*b* may include multiple layers, e.g., metal layers and/or insulating layers as may be used for the conductive traces, including transmission lines, electrical ground, power, and the like. In at least some embodiments, the lower circuit layer 404*b* also includes one or more discrete components, such as a blocking capacitor, a first inductor, sometimes referred to as a radio frequency (RF) choke and a second inductor, as described in relation to the upper circuit layer 404*a*. The lower circuit layer 404*b* with the components mounted thereon provides a lower bias tee circuit 402*b*.

Considering the presence of components on the backside of the board, a substantially solid electrically conductive plane, e.g., a ground plane 406, can be provided substantially between the upper and lower circuit layers 404*a*, 404*b*, e.g., to improve P-N crosstalk. In order to position components on the back side of the board, i.e., the lower circuit layers 404*b*, a via connection 420 can be provided. The via connection 420 links the upper circuit layer 404*a* on a top side of the compact differential bias tee module 400 to the lower circuit layer 404*b* on the bottom side of the compact differential bias tee module 400. It is understood that an incorporation of the via connection 420 would be subject to fabrication rules, which may vary depending on the module technology and intricacies surrounding the substrate core 407.

Figure 5:
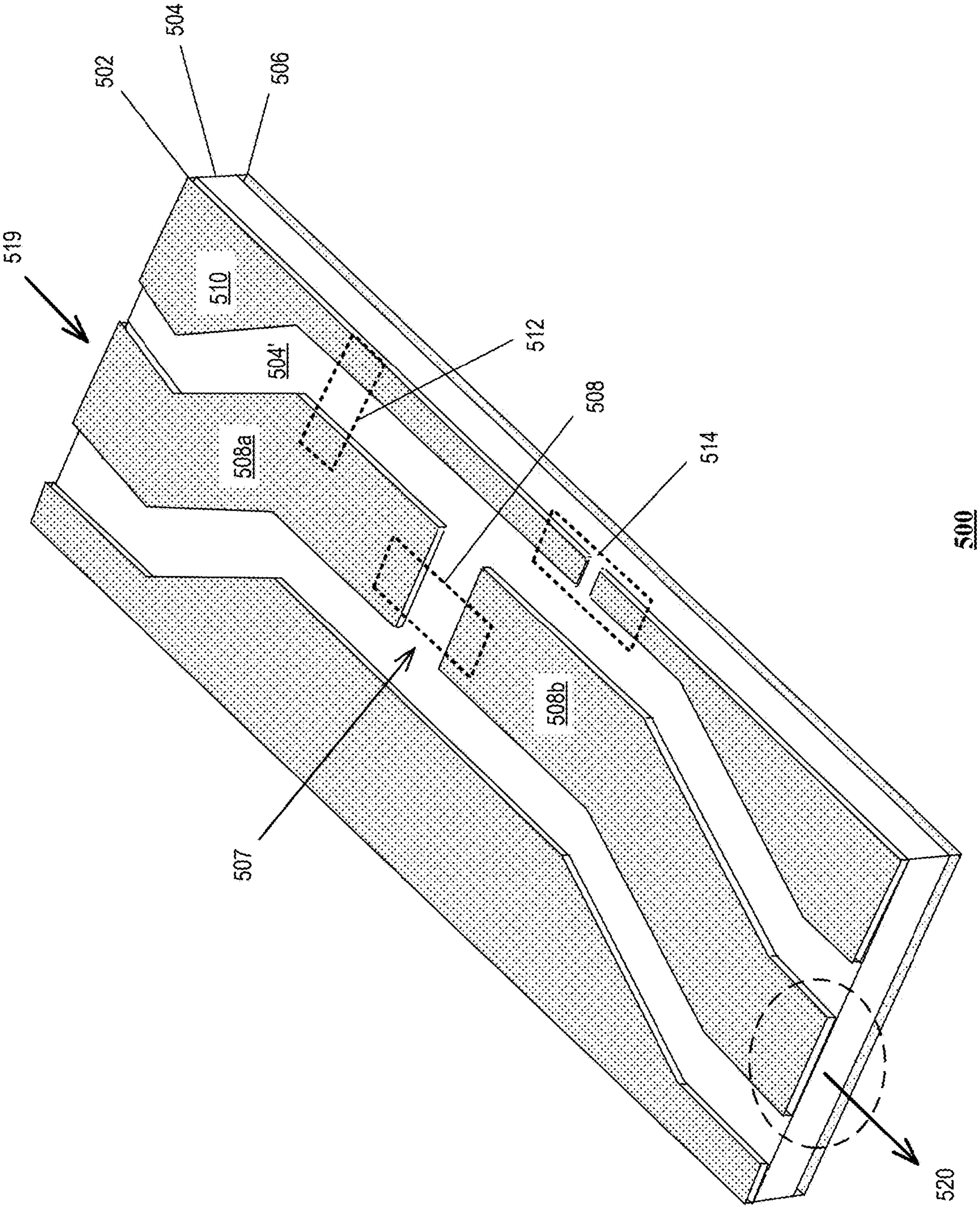
FIG. 5 depicts an illustrative embodiment of an upper circuit layer of a differential bias tee in accordance with various aspects described herein.

FIG. 5 depicts an illustrative embodiment of an upper circuit layer 500 of a differential bias tee in accordance with various aspects described herein. The upper circuit layer 500 includes a first metal layer 502 and a second metal layer 506 separated by an insulating layer 504. An electrically conductive circuit can be formed in one or more of the first and second metal layers 502, 506. For example, the first metal layer 502 can be configured to have a first circuit path including first and second path segments 508*a*, 508*b* and a second circuit path 510 separated by an exposed insulating region 504' of the insulating layer 504. In at least some embodiments, the first metal layer 502 may include one or more electrically conductive terminals and/or pads configured for interconnections to electronic components. According to the illustrative example, a first pad region 508 is configured to accept a blocking capacitor, e.g., positioned across a gap 507 along the first circuit path 508*a*, 508*b*. A second pad region 512 is configured to accept a first inductor, e.g., positioned between a first segment 508*a* of the first circuit path and the second circuit path 510. A third pad region 514 is configured to accept a second inductor, e.g., positioned along the second circuit path 510.

The upper circuit layer 500 is configured to receive in input signal, e.g., a positive portion of a differential input signal, at an input port 519 and to provide an output signal, e.g., a positive portion of a differential output signal at an output port 520. At least some of the first and second circuit segments 508*a*, 508*b* or the second circuit path 510 may be configured for high frequency operation. Accordingly, the first and second circuit segments 508*a*, 508*b* and/or the second circuit path 510 may include high frequency transmission line structures, such as any of the examples described herein and/or otherwise generally known. For example, in at least some embodiments, the transmission line structure may include one or more of the first and second circuit segments 508*a*, 508*b* and/or the second circuit path 510 may incorporate at least some regions of the insulating layer 504 and the conductive second layer 506 to obtain a transmission line structure having a characteristic impedance.

Figure 6A:
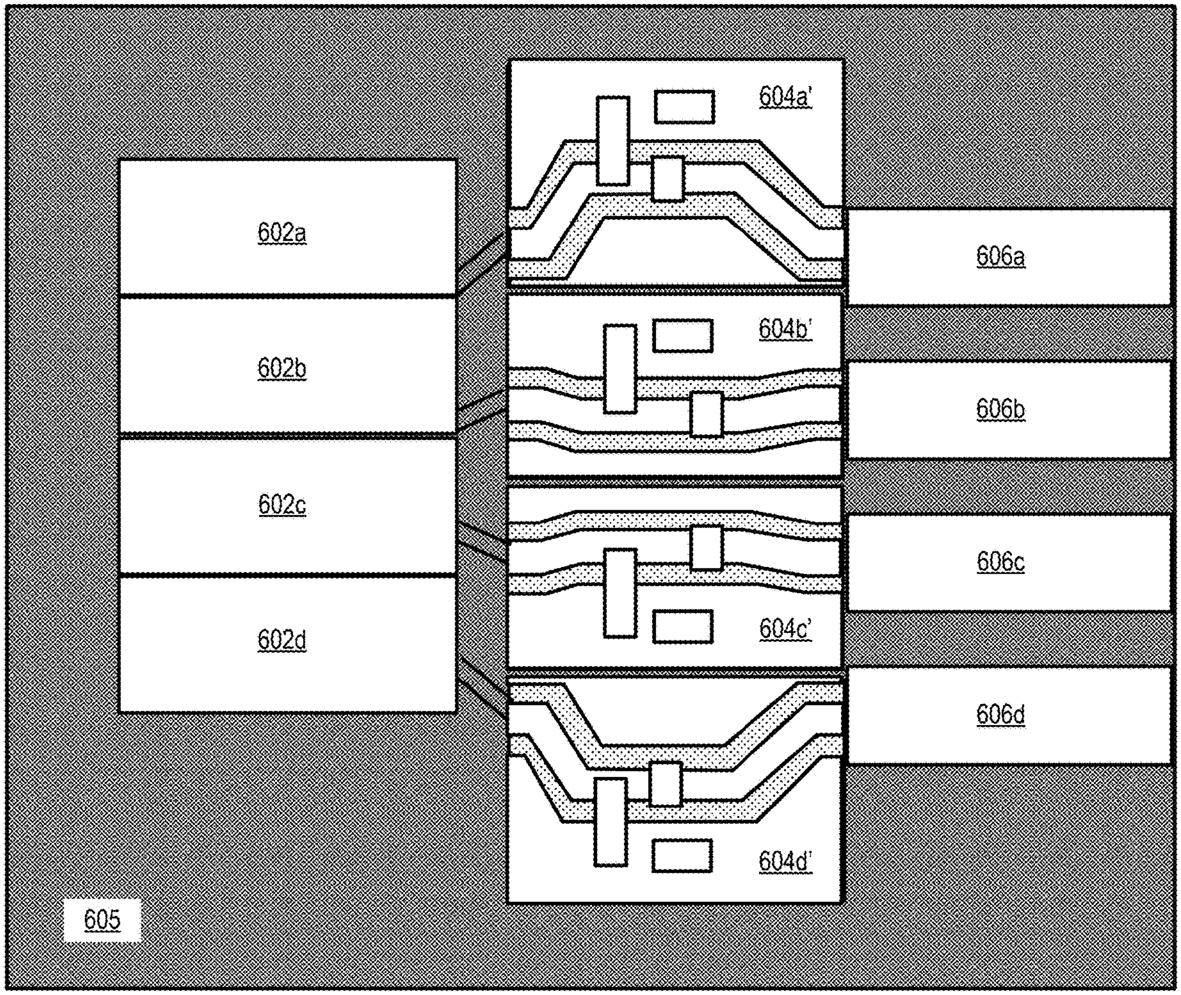
FIG. 6A is a top planar view if an example, non-limiting embodiment of a quad-modulator assembly comprising four compact differential bias tee assemblies in accordance with various aspects described herein.

FIG. 6A is a top planar view if an example, non-limiting embodiment of a quad-modulator assembly 600 comprising four compact differential bias tee assemblies in accordance with various aspects described herein. The example quad-modulator assembly 600 includes four signal driver modules 602*a*, 602*b*, 602*c*, 602*d*, generally 602, configured to provide respective differential signal outputs suitable for driving other devices. According to the illustrative embodiment, the quad-modulator assembly 600 also includes four modulator modules 606*a*, 606*b*, 606*c*, 606*c*, generally 606. In this example, the modulator modules 606 are single-ended devices configured to be driven by one leg of the differential signal outputs, e.g., the first or positive (+) leg. It is understood that in other embodiments, the modulator modules 606, when single ended devices, may be driven by a second or negative (−) leg of the differential signal outputs and/or by combinations of positive and negative legs of the differential signal outputs. Alternatively, or in addition, at least some of the modulator modules can be configured as differential devices, e.g., each modulator being driven by both positive and negative legs of a differential output.

Continuing with the illustrative example, the quad-modulator assembly 600 includes four compact differential bias tee (CDBT) modules. The CDBT modules include upper portions 604*a*', 604*b*', 604*c*', 604*d*', generally 604', positioned on a top side of a substrate 605 and corresponding bottom portions positioned on a bottom side of the substrate 605. In at least some embodiments, the upper portions 604' and the lower portions of the CDBT modules substantially overlap each other. Each upper portion 604' of the CDBT can include circuit components configured to provide a biasing offset voltage and/or current to the signal driver modules 602, without substantially interfering with the time varying (AC) performance of the differential output signal according to the various embodiments disclosed herein. The circuit components also can be configured to facilitate transfer of at least a portion of the differential output signal, e.g., positive legs, to the modulator modules 606, while also blocking and/or otherwise prohibiting application of the biasing offset voltage and/or current thereto according to the various embodiments disclosed herein. Furthermore, the circuit components can be configured to block and/or otherwise prohibit application of the time-varying (AC) differential signal to a biasing source providing the biasing offset voltage and/or current according to the various embodiments disclosed herein.

It should be appreciated that the upper portions 604' of the CDBT modules occupy respective areas of the substrate 605. In at least some embodiments, a relative size of the upper portions 604' of the CDBT modules is comparable to and/or larger than a spacing between the signal driver modules 602. In such instances, the interconnections between the signal driver modules 602 and the upper portions 604' of the CDBT modules may require a "fanout" in which signal paths are routed according to a fanout design. It is understood that a fanout generally represents additional circuit real estate, additional propagation delay, additionally signal path loss, as examples of fanout consequences that without careful attention to details, can result in unwanted differences in performance between the four modulator modules 606. Accordingly, reducing size requirements of the CDBT devices tends to relieve fanout requirements, e.g., facilitating management of signal routing to reduce, eliminate and/or otherwise minimize performance or operational differences between the four modulator modules 606.

In at least some embodiments, circuit designs, components and/or layouts, e.g., paths and/or routes of the CDBT modules may vary from module to module in order to counteract deleterious consequences of fanout. For example, signal paths within the CDBT modules having a shorter fanout interconnection may provide a different, e.g., longer, signal path to compensate for the shorter fanout. Likewise, signal paths within the CDBT modules having a longer fanout interconnection may provide a different, e.g., shorter, signal path to compensate for the longer fanout. In at least some embodiments, choices of circuit layout, component design and/or values and the like may be adjusted between different CDBT modules to achieve similar benefits.

Figure 6B:
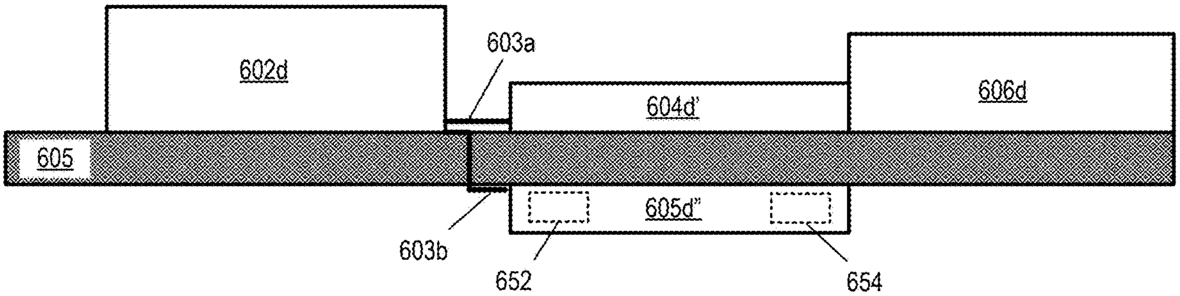
FIG. 6B is a side elevation, end view if the example, non-limiting embodiment of the quad-modulator assembly illustrated in FIG. 6A in accordance with various aspects described herein.

FIG. 6B is a side elevation, end view 650 if the example, non-limiting embodiment of the quad-modulator assembly 600 illustrated in FIG. 6A in accordance with various aspects described herein. The signal driver module 602*d* is positioned along a top side of the substrate 605 together with the upper portion 604*d'* of the CDBT module and the modulator module 606*d*. A positive leg of a differential output of the signal driver module 602*d* is coupled to the upper portion 604*d'* of the CDBT module via a first signal path 603*a*, which is coupled, in turn, to the modulator module 606*d*. A lower portion 694*d''* of the CDBT module is positioned along a bottom side of the substrate 605 in an overlapping, space-saving arrangement. A negative leg of the differential output of the signal driver module 602*d* is coupled to the lower portion 604*d''* of the CDBT module via a second signal path 603*b* that includes a via. The lower portion 604*d''* of the CDBT module can include an impedance matching circuit 652 as may be beneficial to compensate for any detrimental effects to the second signal path 603*b* introduced by the via. According to the illustrative embodiment, the modular module 606*d* is a single-ended modulator being driven by the positive leg of the differential output of the signal driver module 602*d*. In this instance, the lower portion 604*d''* can incorporate a terminating or load impedance 654 into which the negative leg of the differential output of the signal driver module 602*d* may be driven.

To address a potential impedance mismatch problem that arises from the via connection on the backside of the board, the N side can be loaded, e.g., at the terminating end, with an appropriate match, e.g., the load impedance 654. This ensures that both the P and N terminals of the driver see similar load impedances, mitigating any potential impedance mismatch issues. When there is a mismatch in the impedance presented to the positive (P) and negative (N) terminals of a differential driver, it can have several consequences that impact the performance of the system. Firstly, this impedance mismatch can result in voltage level and timing discrepancies between the P and N signals. As a result, signal distortion may occur, leading to a degradation in overall signal integrity and performance. Furthermore, the common-mode rejection capability of the differential driver modules 602 may be compromised. Normally, a differential driver is designed to reject common-mode noise, which is noise that appears equally on both P and N terminals. However, if the load impedance mismatch causes variations in the common-mode voltage, the driver may struggle to effectively reject this noise. Consequently, the system becomes more susceptible to interference.

In addition, the power dissipation characteristics of the differential driver may be affected. These driver module 602 are typically designed to evenly distribute power between the P and N terminals. However, if there is an imbalance in power consumption due to the load impedance mismatch, it can lead to unequal power distribution. This imbalance can potentially impact the thermal management of the driver modules 602.

It is understood that the modulator modules 606 can be configured according to various techniques as may be well suited for an intended communication medium. For example, at least some of the modulator modules 606 may modulate a current and/or a voltage applied to an electrical circuit, such as a communication cable, a transmission line, a waveguide and/or an antenna. It is understood that a transducer may be utilized to facilitate operation according to the particular communication medium. Alternatively, or in addition, at least some of the modulator modules 606 may be configured to modulate an optical source, e.g., a fiberoptic modulator as may be applied to a laser, a laser diode and/or a light emitting diode (LED) source. In at least some embodiments, at least some of the modulator modules 606 include an interferometer, e.g., a mach-zehnder interferometer. In at least some embodiments, the modulator module 606 includes a photonic integrated circuit. In at least some embodiments, the photonic integrated circuit includes a silicon-on-insulator (SoI) configuration, For example, the semiconductor material of the modulator module 606 may include one or more of InP, LiNbO3, GaAs and the like. In at least some embodiments, the modulator module 606 includes a thin-film-Lithium-Niobate-on-insulator (TFLN) configuration.

Figure 7A:
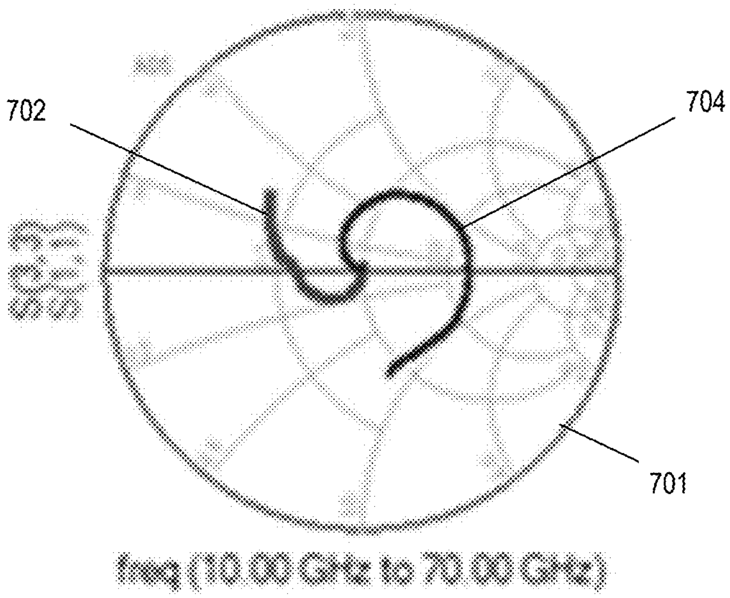
FIG. 7A depicts a graphical representation of impedance values seen by P and N terminals of a differential input for an unmatched condition.

FIG. 7A depicts a graphical representation of impedance values 700 seen by the P and N terminals of the differential input for an unmatched condition, e.g., without the benefit of a matched load impedance. In particular, the impedance values are presented on a Smith chart 701 over a substantially wideband operational frequency range between about 10 GHz and about 70 GHz. A first curve 702 represents an impedance measurement according to an $S_{11}$ parameter and a second curve 704 represents an impedance measurement according to an $S_{22}$ parameter. As depicted in the graphical representation of impedance values 700, the first curve 702 represents an impedance seen by the P terminal, while the second line represents an impedance seen by the N terminal of a driver, e.g., the drive module 602*d* (FIG. 6A).

By implementing the appropriate matching network, the impedance seen by the N terminal can be adjusted to match that of the P terminal, ensuring balanced performance and maintaining a high CMRR (common mode rejection ratio). Avast disparity between the first and second curves 702, 704 is observable over substantially the entire operational frequency range.

Figure 7B:
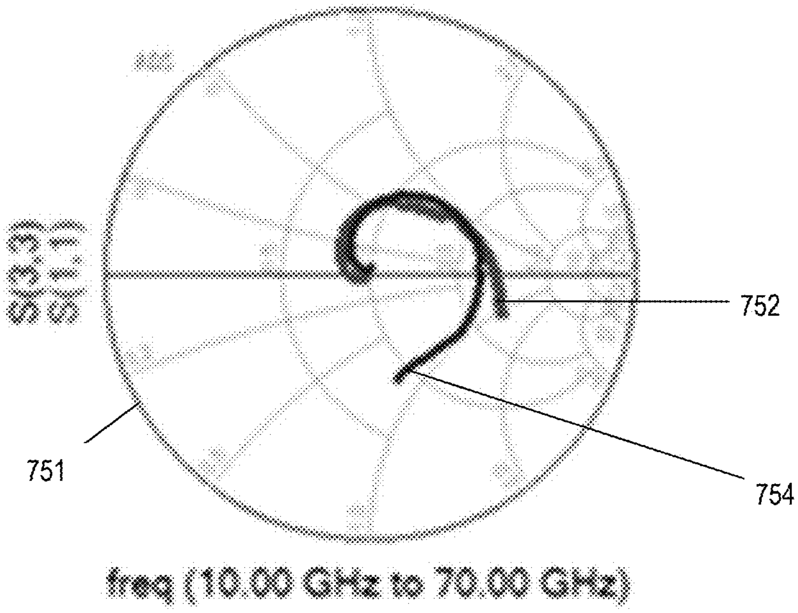
FIG. 7B depicts a graphical representation of impedance values seen by P and N terminals of a differential input for a matched condition.

FIG. 7B depicts a graphical representation of impedance values 750 seen by the P and N terminals of the differential input for a matched condition, e.g., with the benefit of a matched load impedance. In particular, the impedance values are presented on a Smith chart 751 over substantially the same wideband operational frequency range. A first curve 752 represents an impedance measurement according to an $S_{11}$ parameter and a second curve 754 represents an impedance measurement according to an $S_{22}$ parameter. A vastly improved match between the first and second curves 752, 754 is observable over a substantial portion of the operational frequency range.

At least some embodiments of compact differential bias tee assemblies incorporate a three-element integrated matching network configured for seamless integration within a substrate, e.g., within a circuit board including an integrated circuit, itself. Such integrated matching networks can be configured to significantly enhance an operational bandwidth, e.g., a −10 dB bandwidth, extending it in the illustrative example, from 60 GHz to 70 GHz. Moreover, the integrated network can effectively eliminate any impedance mismatch between the P and N terminals.

Figure 8:
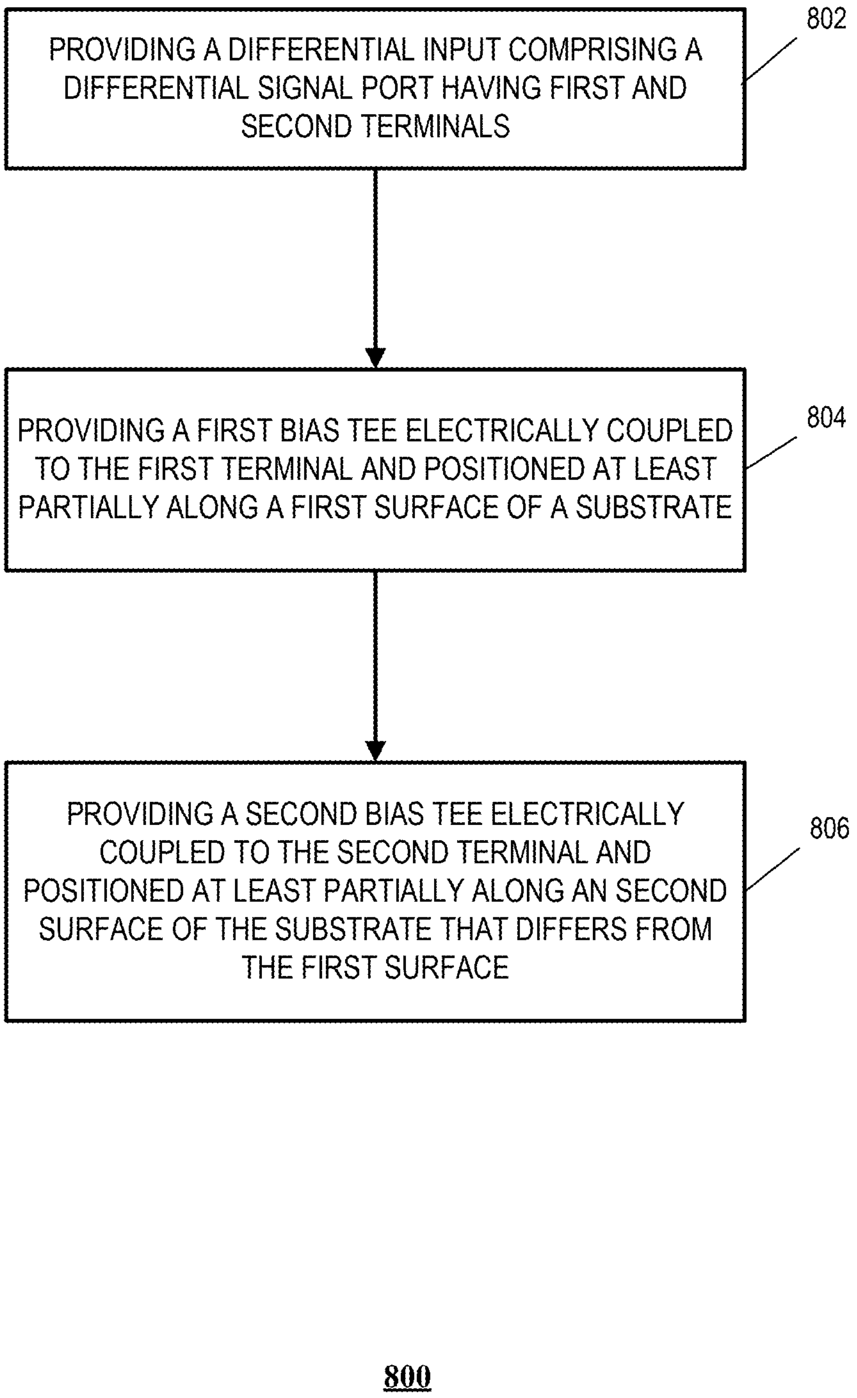
FIG. 8 depicts an illustrative embodiment of a compact differential bias tee fabrication process in accordance with various aspects described herein.

FIG. 8 depicts an illustrative embodiment of a compact differential bias tee (CDBT) fabrication process 800 in accordance with various aspects described herein. According to the example CDBT fabrication process 800, a differential input is provided at 802. The differential input includes a first input terminal and a second input terminal. In at least some embodiments, the first and second terminals are associated with a differential signal port, e.g., having first and second signal portions or legs as in at least some embodiments, may be represented as positive (+) and negative (−) legs.

Further according to the example CDBT fabrication process 800, a first bias tee circuit is electrically coupled to the first terminal of the differential signal port and positioned at least partially on a first surface of a supporting member or substrate at 804. In at least some embodiments, the substrate may include a PCB, an integrated circuit, or other suitable structure suitable for supporting electrical conductors, e.g., transmission lines and/or for attachment of electronic devices, e.g., inductors, capacitors and/or resistors. Without limitation, the substrate can be substantially rigid flexible or a combination of both. It is understood further that the substrate may be substantially planar, non-planar or a combination of both. The first bias tee circuit can include any of the examples disclosed herein and/or otherwise generally known to provide a bias tee function according to a particular design as may be determined at least in part according to a target frequency and/or a target bandwidth of operation. Other design parameters may include one or more of characteristic impedance, a power requirement, a fabrication technology, and so on.

Still further according to the example CDBT fabrication process 800, a second bias tee circuit is electrically coupled to the second terminal of the differential signal port and positioned at least partially on a second surface of the substrate at 806. The second surface differs from the first surface. For example, the first and second surfaces may not exist within the same plane. In at least some embodiments, the first and second surfaces may be aligned within substantially parallel planes. Alternatively, or in addition the first and second surfaces may not be aligned in parallel surfaces. In at least some embodiments, the first and second surfaces are substantially orthogonal surfaces. The second bias tee circuit can include any of the examples disclosed herein and/or otherwise generally known to provide a bias tee function according to a particular design as may be determined at least in part according to a target frequency and/or a target bandwidth of operation. Other design parameters may include one or more of characteristic impedance, a power requirement, a fabrication technology, and so on. The first bias tee circuit may occupy a first surface area of the substrate, while the second bias tee circuit occupies a second surface are of the substrate. In at least some embodiments, at least a portion of the first bias tee circuit overlaps at least a portion of the second bias tee circuit, e.g., in order to realize a compact and/or space-saving arrangement. In at least some embodiments, at least one if the first and second bias tee circuits completely overlaps or overshadows another one of the first and second bias tee circuits, e.g., in order to enhance and/or otherwise maximize a compactness and/or space-savings arrangement.

It is understood that in at least some embodiments the first and second bias tee circuits can be provided to facilitate driving a differential device, such as differential modulator according to a differential input signal as may be provided by a differential signal driver device. Alternatively, or in addition, at least one of the first and second bias tee circuits can be provided to facilitate driving a single-ended device, such as a single-ended modulator according to one leg of a differential input signal. In at least some single-ended embodiments, a non-driving one of the first and second bias tee circuits may be coupled to a load impedance in place of a driven device. Beneficially, incorporation of the second bias tee circuit in combination with the load impedance into the CDBT module can facilitate application of a differential driver for single-ended applications, e.g., by maintaining at least some degree of symmetry between the two circuit legs driven by the differential input signal.

While for purposes of simplicity of explanation, the respective processes are shown and described as a series of blocks in FIG. 8, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Note, one or more blocks can be performed in response to one or more other blocks.

Figure 9A:
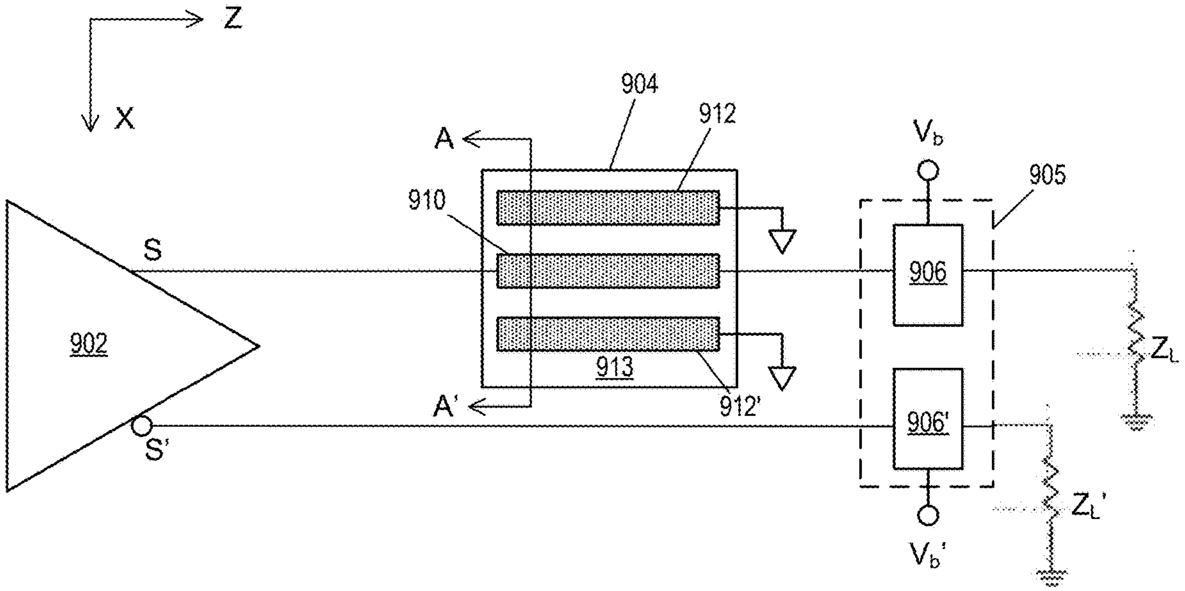
FIG. 9A is a schematic diagram illustrating an example, non-limiting embodiment of a modulator system in accordance with various aspects described herein.

FIG. 9A is a schematic diagram illustrating an example, non-limiting embodiment of a modulator system 900 in accordance with various aspects described herein. The modulator system 900 includes a differential driver 902 providing a differential driving signal denoted by a first signal terminal S, e.g., a positive (+) signal terminal of the differential signal output, and a second signal terminal S', e.g., a negative (−) or inverted signal terminal of the differential signal output. According to the illustrative example, the modulator system 900 further includes a modulator device 904 and a differential bias tee 905 provided in a termination network of the modulator device 904. The differential bias tee 905 is configured with a first bias tee circuit 906 and a second bias tee circuit 906', with each bias tee circuit 906, 906' respectively including a biased signal terminal, an unbiased signal terminal and a biasing signal terminal connected to a bias supply. It is understood that the differential bias tee 905 can include any of the various compact, space-saving configurations disclosed herein and/or otherwise consistent with the space-saving techniques disclosed herein.

According to the illustrative embodiment, the modulator device 904 is a single-ended, modulator device 904 having an input coupled to the first signal terminal S and an output coupled to a first signal terminal of the first bias tee circuit 906. In more detail, the single-ended, modulator device 904 includes a signal lead 910 and two adjacent leads 912, 912, which according to the illustrative embodiment, are coupled to an electrical ground. It is understood that in at least some high-frequency RF applications, the signal lead 910 and adjacent signal leads may be configured to provide a transmission line that supports sufficient high-frequency RF operations. A second signal terminal of the first bias tee circuit 906 may be coupled to a load impedance $Z_L$ as may be beneficial for high-speed RF signals. In at least some embodiments, the first signal terminal may include the unbiased signal terminal, while the second signal terminal may include the biased signal terminal. Alternatively, or in addition, the first signal terminal may include the biased signal terminal, while the second signal terminal may include the unbiased signal terminal.

Figure 9B:
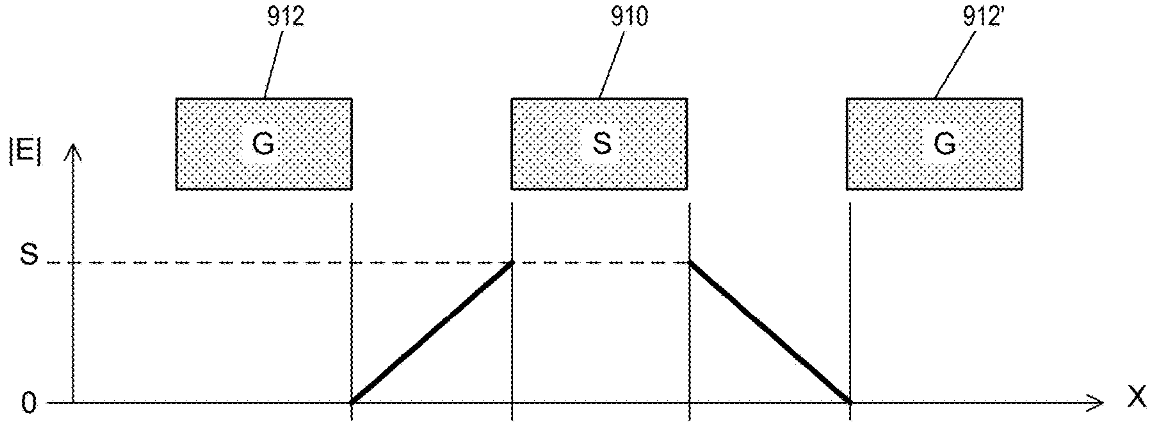
FIG. 9B is a schematic diagram illustrating a cross-sectional view of the example, non-limiting embodiment of a modulator system illustrated in FIG. 9A in accordance with various aspects described herein.

FIG. 9B is a schematic diagram illustrating a cross-sectional view 920 of the example, modulator system 900 illustrated in FIG. 9A in accordance with various aspects described herein. In particular, the signal lead 910 and the adjacent signal leads 912, 912' may be aligned, e.g., coplanar, having been formed upon the supporting substrate 913. Also illustrated in relation to the cross-sectional view 920 is a representation of an electrical field as may be generated within the supporting substrate 913 by application of a driving signal. According to the illustrated, single-ended example, the electric field may extend from a maximum potential value at the signal lead 910 to substantially zero potential at either of the adjacent signal leads 912, 912'.

Figure 9C:
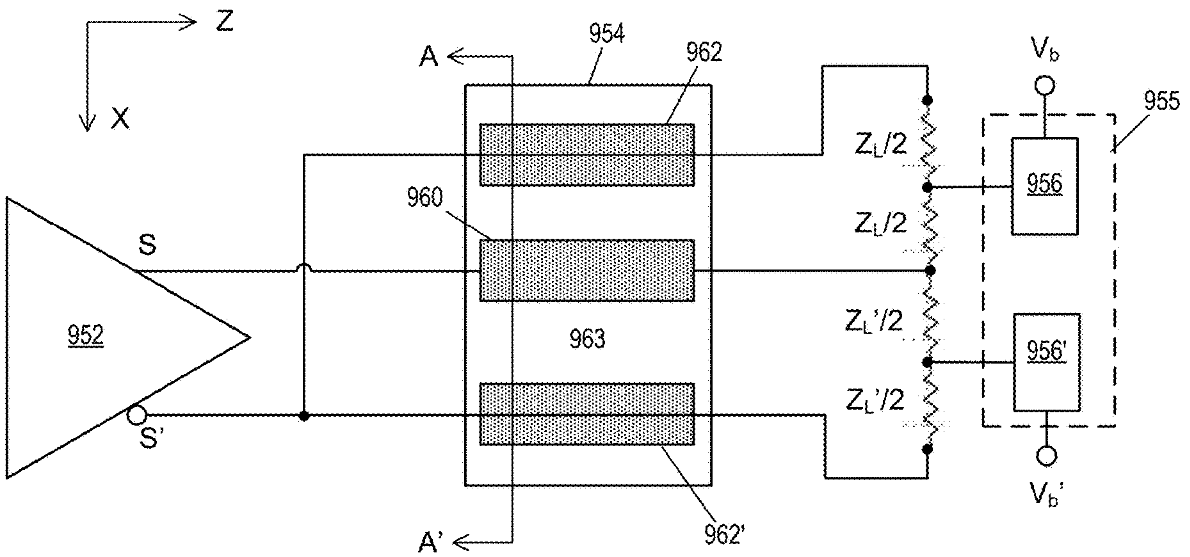
FIG. 9C is a schematic diagram illustrating another example, non-limiting embodiment of a modulator system in accordance with various aspects described herein.

FIG. 9C is a schematic diagram illustrating another example, non-limiting embodiment of a modulator system 950 in accordance with various aspects described herein. The modulator system 950 includes a differential driver 952 providing a differential driving signal denoted by a first signal terminal S, e.g., a positive (+) signal terminal of the differential signal output, and a second signal terminal S', e.g., a negative (−) or inverted signal terminal of the differential signal output. The modulator system 950 further includes a modulator device 954 and a differential bias tee 955 provided in a termination network of the modulator device 954. The differential bias tee 955 is configured with a first bias tee circuit 956 and a second bias tee circuit 956', with each bias tee circuit 956, 956' respectively including a biased signal terminal, an unbiased signal terminal and a biasing signal terminal connected to a bias supply. It is understood that the differential bias tee 955 can include any of the various compact, space-saving configurations disclosed herein and/or otherwise consistent with the space-saving techniques disclosed herein.

According to the illustrative embodiment, the modulator device 954 is a differential modulator device 954 having a differential input coupled to the first and second signal terminal S, S' of the differential driver and a differential output coupled to a first signal terminal of the first bias tee circuit 956 and a first signal terminal of the second bias tee circuit 956. According to the example configuration and considering $Z_L=Z_L'=80\Omega$, e.g., to make a singled ended 40Ω load, to a two center tapped 80Ω terminations (in essence two 40Ω to what would otherwise be a "ground" strip on either side, and two 40Ω to the center signal lead 960, with bias tees 956, 956' in the center tap to provide a lower impedance DC path. Beneficially, this configuration provides for a substantially equal potential between the S signal lead 960 and the left signal lead 962 S (GND) and the right signal lead 962' S' (GND), to avoid any unwanted introduction of a bias-drift, and imbalance and/or a "chirp".

In more detail, the differential modulator device 954 includes a signal lead 960 coupled to the first signal terminal S and two adjacent leads 962, 962, coupled to the second signal terminal S'. It is understood that in at least some high-frequency RF applications, the signal lead 960 and adjacent signal leads 962, 962' may be configured to provide a transmission line that supports sufficient high-frequency RF operations. A second signal terminal of the first bias tee circuit 906 may be coupled to one end of a series load impedance $Z_L/2+Z_L/2$ as may be beneficial for high-speed RF signals. Likewise, a second signal terminal of the second bias tee circuit 956' may be coupled to one end of another series load impedance $Z_L'/2+Z_L'/2$ as also may be beneficial for high-speed RF signals. The two series load impedances may be coupled in series, as illustrated, and an output of the signal lead 960 may be coupled between the series load impedances, as illustrated to provide a suitably balanced load. A second signal terminal of the first bias tee circuit 956 may be coupled between the first series load impedance, while a second signal terminal of the second bias tee circuit 956 is coupled between the second series load impedance. In at least some embodiments, the first signal terminal may include the unbiased signal terminal, while the second signal terminal may include the biased signal terminal. Alternatively, or in addition, the first signal terminal may include the biased signal terminal, while the second signal terminal may include the unbiased signal terminal.

Figure 9D:
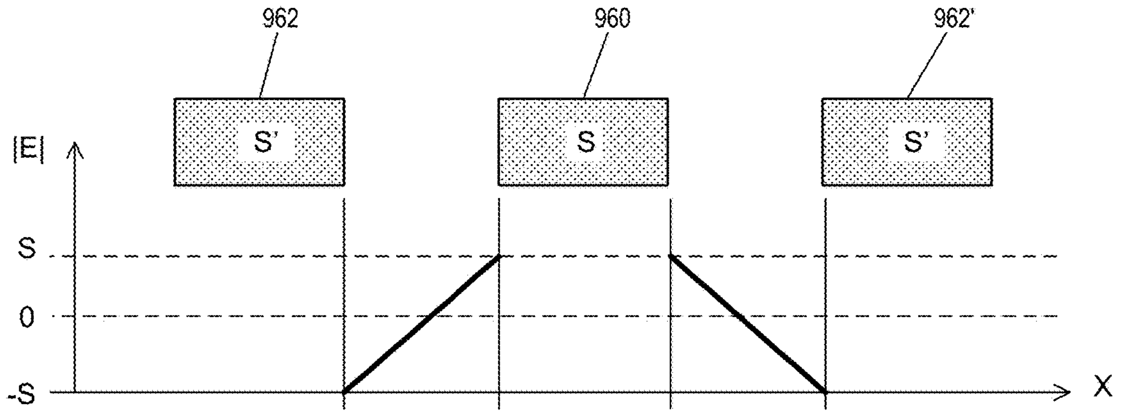
FIG. 9D is a schematic diagram illustrating a cross-sectional view of the example, non-limiting embodiment of a modulator system illustrated in FIG. 9C in accordance with various aspects described herein.

FIG. 9D is a schematic diagram illustrating a cross-sectional view 970 of the example, non-limiting embodiment of a modulator system 950 illustrated in FIG. 9C in accordance with various aspects described herein. In particular, the signal lead 960 and the adjacent signal leads 962, 962' may be aligned, e.g., coplanar, having been formed upon the supporting substrate 963. Also illustrated in relation to the cross-sectional view 970 is a representation of an electrical field as may be generated within the supporting substrate 963 by application of a driving signal. According to the illustrated differential signal example, the electric field may extend from a maximum potential value at the signal lead 960 to a negative potential at either of the adjacent signal leads 962, 962'.

It is understood that in at least some applications, a network topology, e.g., an optimal network topology of an impedance matching network, may be obtained by design processes using a representative schematic-based simulation tool. For example, in at least some embodiments, a network topology may be determined, e.g., selected and/or otherwise identified. For example, bias tee network topology having a capacitor and an inductura may be identified or selected. Once the topology has been selected, an optimization algorithm, e.g., a genetic optimization algorithm, can be employed to finetune the network. In at least some embodiments, the algorithm may be employed in view of an operational bandwidth, e.g., about 70 GHz. A resulting optimized solution, along with a required element impedance and electrical length, can be obtained according to the algorithm.

In at least some embodiments, one or more of the circuit elements identified by the algorithm may be implemented using transmission line structures. To determine the physical dimensions of the elements, e.g., the three elements, an impedance line calculator can be employed, to obtain dimensions of transmission line segments corresponding to the elements. A resulting transmission line structure can then be incorporated into one or more of the bias tee circuits to obtain an improved impedance match performance, e.g., as observable via an $S_{11}$ value. For example, it has been observed that an improvement in S11 with this approach can be quite significant. Namely, when compared to a standalone inductor, an integrated matching network obtained by the example process extends the −10 dB bandwidth from 60 GHz to 70 GHz. In at least some instances, the integrated matching network may introduce a slight insertion loss at lower frequencies.

Beneficially, the example devices, systems and processes disclosed herein to achieve compact layout configurations of differential bias tees eliminates the need for additional routing to connect a driver and modulator, thereby reducing insertion loss and minimizing skew issues. As operational frequencies of electronic systems increase, e.g., communication systems, it becomes essential to optimize an analog/RF signal chain, considering factors such as crosstalk, skew, and/or total RF chain insertion loss. The example devices, systems and processes disclosed herein contribute to optimization of the RF chain and enhance overall performance.

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

Further, the various embodiments can be implemented as a method, apparatus or article of manufacture using standard programming and/or engineering techniques to produce software, firmware, hardware, or any combination thereof to control a computer to implement the disclosed subject matter. The term "article of manufacture" as used herein is intended to encompass semiconductor devices, wafers, integrated circuits, circuit modules, modules, systems and/or components incorporating semiconductor devices, as well as a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data. Computer-readable storage media can comprise the widest variety of storage media including tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to," "coupled to," and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A differential biasing device comprising:

a first bias tee positioned at least partially along a first layer of a substrate, wherein the first bias tee comprises a first biased radio frequency (RF) terminal, a first unbiased RF terminal and a first biasing terminal; and a second bias tee positioned at least partially along a second layer of the substrate, wherein the second bias tee comprises a second biased RF terminal, a second unbiased RF terminal and a second biasing terminal, and wherein the first layer differs from the second layer facilitating a compact configuration of the first bias tee and the second bias tee.

2. The differential biasing device of claim 1, wherein the first bias tee overlaps at least a portion of the second bias tee.

3. The differential biasing device of claim 2, wherein at least one of the first layer the second layer comprises a surface layer, and wherein the first layer and the second layer are opposing layers, the differential biasing device further comprising:

a conductive plane disposed at least partially between the opposing layers, wherein the first bias tee is positioned at least partially over the conductive plane, and wherein the second bias tee is positioned at least partially under the conductive plane.

4. The differential biasing device of claim 3, further comprising:

an electrically conductive via facilitating electrical communication between the first layer and the second layer.

5. The differential biasing device of claim 1, wherein the first bias tee comprises a first capacitive circuit and a first inductive circuit.

6. The differential biasing device of claim 5, wherein the first inductive circuit comprises a first inductive impedance coupled between the first biasing terminal and the first biased RF terminal.

7. The differential biasing device of claim 5, wherein the first capacitive circuit is electrically coupled between the first unbiased RF terminal and each of the first biasing terminal and the first biased RF terminal.

8. The differential biasing device of claim 1, wherein at least a portion of an applied first bias voltage applied to the first biasing terminal offsets a first biased RF signal at the first biased RF terminal, while the applied first bias voltage does not offset a first unbiased signal at the first unbiased RF terminal.

9. The differential biasing device of claim 1, wherein the substrate is one of a printed circuit board (PCB), a semiconductor device, a wafer die, or any combination thereof.

10. The differential biasing device of claim 9, further comprising:

a terminating load impedance coupled to at least one of the second biased RF terminal or the second unbiased RF terminal.

11. The differential biasing device of claim 10, wherein the terminating load impedance comprises one of a surface mount resistor, an integrated circuit resistor, a transmission line circuit, or any combination thereof.

12. The differential biasing device of claim 1, wherein the first layer and the second layer are overlapping layers, and wherein the first bias tee is configured according to a substantially mirror-imaged arrangement with respect to the second bias tee.

13. The differential biasing device of claim 1, further comprising:

an impedance matching circuit in communication with at least one of the first bias tee or the second bias tee.

14. A method of fabricating a differential biasing assembly comprising:

providing a first bias tee positioned at least partially along a first layer of a substrate, wherein the first bias tee comprises a first biased high-frequency terminal, a first unbiased high-frequency terminal and a first biasing terminal; and providing a second bias tee positioned at least partially along a second layer of the substrate, wherein the second bias tee comprises a second biased high-frequency terminal, a second unbiased high-frequency terminal and a second biasing terminal, and wherein the first layer differs from the second layer facilitating a non-coplanar configuration of the first bias tee and the second bias tee.

15. The method of fabricating a differential biasing assembly of claim 14, wherein at least one of the first layer and the second layer comprises a surface layer of the substrate, and wherein the providing the first bias tee further comprises:

electrically coupling at least one of a first capacitive circuit or a first inductive circuit to the surface layer of the substrate, wherein at least a portion of the first bias tee at least partially overlaps at least a portion of the second bias tee.

16. The method of fabricating a differential biasing assembly of claim 14, further comprising:

coupling at least one of the first bias tee and the second bias tee between a differential driver device and a modulator device, wherein the differential driver device is configured to drive the modulator device according to at least a portion of a differential input signal.

17. The method of fabricating a differential biasing assembly of claim 14, further comprising:

coupling at least one of the first bias tee and the second bias tee between a modulator device and a termination network.

18. A differentially driven modulator system comprising:

a differential input port comprising a first input terminal and a second input terminal, wherein the differential input port is configured to receive a differential input signal;

a first bias tee in communication with the first input terminal and positioned at least partially along a first layer of a substrate, wherein the first bias tee comprises a first biased radio frequency (RF) terminal, a first unbiased RF terminal and a first biasing terminal;

a second bias tee in communication with the second input terminal and positioned at least partially along a second layer of the substrate, wherein the second bias tee comprises a second biased RF terminal, a second unbiased RF terminal and a second biasing terminal; and an output port comprising a first output terminal in communication with the first bias tee, wherein the first output terminal is configured to drive a modulator according to a first portion of the differential input signal, while inhibiting an application of the first biasing voltage to the modulator.

19. The differentially driven modulator system of claim 18, wherein the modulator comprises a single-ended modulator device, and wherein the output port comprises a second output terminal configured to drive a load impedance according to a second portion of the differential input signal.

20. The differentially driven modulator system of claim 18, wherein the modulator comprises a differential modulator device, and wherein the output port comprises a second output terminal in communication with the second bias tee, wherein the second output terminal is configured to drive the differential modulator device according to a second portion of the differential input signal, while inhibiting an application of the second biasing voltage to the differential modulator device.

* * * * *